United States Patent
Fan et al.

(10) Patent No.: US 7,714,348 B2
(45) Date of Patent: May 11, 2010

(54) AC/DC LIGHT EMITTING DIODES WITH INTEGRATED PROTECTION MECHANISM

(75) Inventors: Zhaoyang Fan, Manhattan, KS (US); Jing Li, Manhattan, KS (US); Jingyu Lin, Manhattan, KS (US); Hongxing Jiang, Manhattan, KS (US)

(73) Assignee: AC-LED Lighting, L.L.C., Lubbock, TX (US)

( * ) Notice: Subject to any disclaimer, the term of this patent is extended or adjusted under 35 U.S.C. 154(b) by 0 days.

(21) Appl. No.: 11/683,293

(22) Filed: Mar. 7, 2007

(65) Prior Publication Data

US 2008/0083929 A1    Apr. 10, 2008

Related U.S. Application Data

(60) Provisional application No. 60/850,135, filed on Oct. 6, 2006.

(51) Int. Cl.
*H01L 33/00* (2010.01)

(52) U.S. Cl. .............. 257/99; 257/59; 257/72; 257/88; 257/536; 257/E33.056; 257/E33.057

(58) Field of Classification Search ............. 257/59, 257/72, 88, 99, 536, E33.056, E33.057; 438/26
See application file for complete search history.

(56) References Cited

U.S. PATENT DOCUMENTS

| | | | |
|---|---|---|---|
| 5,278,432 A | 1/1994 | Ignatius et al. | |
| 5,317,170 A | 5/1994 | Paoli | |
| 5,463,280 A * | 10/1995 | Johnson | 315/187 |
| 5,563,422 A | 10/1996 | Nakamura et al. | |
| 5,652,434 A | 7/1997 | Nakamura et al. | |
| 5,699,073 A | 12/1997 | Lebby et al. | |
| 5,767,581 A | 6/1998 | Nakamura et al. | |
| 5,773,130 A | 6/1998 | So et al. | |
| 5,877,558 A | 3/1999 | Nakamura et al. | |
| 5,929,466 A | 7/1999 | Ohba et al. | |
| 5,952,680 A | 9/1999 | Strite | |
| 5,955,748 A | 9/1999 | Nakamura et al. | |
| 5,966,393 A | 10/1999 | Hide et al. | |
| 6,054,724 A | 4/2000 | Ogihara et al. | |
| 6,093,965 A | 7/2000 | Nakamura et al. | |
| 6,198,405 B1 | 3/2001 | Andersson et al. | |
| 6,410,940 B1 | 6/2002 | Jiang et al. | |

(Continued)

FOREIGN PATENT DOCUMENTS

JP    11-150303    *    2/1999

(Continued)

OTHER PUBLICATIONS

S X Jin, J Li, J Y Lin and H X Jiang, InGaN/GaN Quantum Well Interconnected Microdisk Light Emitting Diodes; Applied Physics Letters, vol. 77, No. 20, p. 3236-3238, Nov. 13, 2000.

(Continued)

*Primary Examiner*—Victor A Mandala
(74) *Attorney, Agent, or Firm*—Lathrop & Gage LLP

(57) ABSTRACT

A highly reliable, high voltage AC/DC LED device with integrated protection mechanism is disclosed. The protection element can be a current-limiting resistor, monolithically integrated on LED chip, or a discrete resistor assembled in the lamp package or submount. The protection elements may also include other parts integrated on a submount.

18 Claims, 18 Drawing Sheets

U.S. PATENT DOCUMENTS

| | | | |
|---|---|---|---|
| 6,455,878 | B1 | 9/2002 | Bhat et al. |
| 6,461,019 | B1 | 10/2002 | Allen |
| 6,547,249 | B2 | 4/2003 | Collins et al. |
| 6,635,902 | B1 | 10/2003 | Lin et al. |
| 6,740,960 | B1 | 5/2004 | Farnworth et al. |
| 6,936,855 | B1 | 8/2005 | Harrah |
| 6,957,899 | B2 | 10/2005 | Jiang et al. |
| 7,045,965 | B2 | 5/2006 | Li et al. |
| 7,148,515 | B1 * | 12/2006 | Huang et al. ............. 257/84 |
| 7,154,149 | B2 * | 12/2006 | Wu et al. ............. 257/355 |
| 7,285,801 | B2 | 10/2007 | Eliashevich et al. |
| 2002/0006040 | A1 | 1/2002 | Kameda et al. |
| 2002/0043943 | A1 | 4/2002 | Menzer et al. |
| 2004/0080941 | A1 | 4/2004 | Jiang et al. |
| 2004/0129946 | A1 | 7/2004 | Nagai et al. |
| 2004/0206970 | A1 | 10/2004 | Martin |
| 2005/0127816 | A1 | 6/2005 | Sumitani |
| 2005/0133816 | A1 | 6/2005 | Fan et al. |
| 2005/0161682 | A1 | 7/2005 | Mazzochette et al. |
| 2005/0185401 | A1 | 8/2005 | Jiang |
| 2005/0251698 | A1 | 11/2005 | Lynch et al. |
| 2005/0253151 | A1 | 11/2005 | Sakai et al. |
| 2005/0254243 | A1 | 11/2005 | Jiang et al. |
| 2006/0044864 | A1 | 3/2006 | Lin et al. |
| 2006/0138443 | A1 | 6/2006 | Fan et al. |
| 2006/0163589 | A1 | 7/2006 | Fan |
| 2006/0169993 | A1 | 8/2006 | Fan |
| 2006/0175681 | A1 | 8/2006 | Li |
| 2006/0180818 | A1 | 8/2006 | Nagai et al. |
| 2006/0181877 | A1 | 8/2006 | Sidwell |
| 2006/0208264 | A1 | 9/2006 | Ryu et al. |
| 2007/0273299 | A1 * | 11/2007 | Miskin et al. ............. 315/250 |

OTHER PUBLICATIONS

Mair et al., Optical properties of GaN/AlGaN multiple quantum well microdisks, Nov. 17, 1997, Appl. Phys, Lett. 76 (5) p. 631, American Institute of Physics.

Jiang and Lin; Advances in iii-Nitride Micro-size light Emitters; Advanced Semiconductor Magazine; vol. 14, No. 5.

Chen, Chang, Chen, Fann, Jiang, and Lin; Mechanism of Photoluminescence in GaN/Al(0.2)Ga(0.8)N Superlattices; Applied Physics Letters, vol. 79, No. 23; Dec. 3, 2001.

Jiang and Lin; On Display; OE Magazine Jul. 2001.

Dr. Jing Li; Ill-Nitride Integrated Photonic Devices (undated).

C. W Jeon, H.W. Choi and M.D. Dawson; A Novel Fabrication Method For A 64×64 Matrix-Addressable GaN-Based Micro-LED Array; Phys. Stat. Sol. (a) No. 1, 78-82, 2003.

Zhaoyang Fan, Hongxing Jiang, Jingyu Lin; Related and Copending U.S. Appl. No. 11/144,982, filed Jun. 3, 2005.

Zhaoyang Fan; Related and Copending U.S. Appl. No. 11/340,296, filed Jan. 26, 2006.

Kansas Researchers Fabricate Blue Micro Light-Emitting Diodes, Paving Way for Microdisplays, Energy Saving Lighting; Ascribe The Public Interest Newswire, Sep. 27, 2001.

Preliminary Report on Patentability in related PCT Patent Application Serial No. PCT/US07/70213, issued Apr. 16, 2009, 8 pages.

* cited by examiner

AC/DC LIGHT EMITTING DIODES WITH INTEGRATED PROTECTION MECHANISM

CROSS-REFERENCE TO RELATED APPLICATIONS

This application claims the benefit of U.S. Provisional Application No. 60/850,135 filed Oct. 6, 2006, which is herein incorporated by reference.

This application is related to, but does not claim the benefit of copending and commonly owned U.S. patent application Ser. No. 11/109,602.

BACKGROUND OF THE INVENTION

1. Field of the Invention

The present invention relates to the design and implementation of AC/DC semiconductor light emitting diode devices and lamps with high reliability by the incorporation of one or more integrated protection mechanisms. In some embodiments, the AC/DC LED is directly powered by an AC voltage (i.e. 100V, 110/120V or 220/240V line voltage, or 6.0 VAC, 12 VAC, 18 VAC and 24 VAC, etc.) or a high DC voltage (i.e. 12V, 48V, etc.). These embodiments can be used in LEDs for low power devices for indication and high power devices for general illumination or lighting. The integrated protection elements have the function of reducing and/or easing the influence of voltage variations on device performance and lifetime.

2. Description of the Prior Art

Conventional LEDs, because of physical limitations, have traditionally only been run under very low DC voltages (roughly between 1V to 5V depending on semiconductor materials used) because of device limitations.

SUMMARY OF THE INVENTION

In embodiments, the present invention provides an integrated protection mechanism on the chip level. This is especially useful for high voltage AC/DC LEDs by limiting the influence of the line voltage variation on the current. In particular embodiments, the protection mechanism may be directly integrated on the AC/DC LED chip, or it may be integrated into the AC/DC LED lamp package, or it may be integrated on the submount of flip-chip bonded AC/DC LED device.

In one embodiment, a current-limiting resistor is monolithically integrated on the AC/DC LED chip. In a preferred embodiment, this current-limiting resistor is fabricated from semiconductor material of the LED structure or the semiconductor layers below the LED structure. In another embodiment, the current-limiting resistor is fabricated by deposition of other materials with suitable resistivity on the LED chip.

According to a second embodiment, a discrete current limiting resistor chip is assembled with the AC/DC LED chip in serial connection in the lamp package. The lamp package may be T1, T1-¾ and other standard or custom LED lamp packages, including both AC/DC indicator LED lamps and AC/DC power LED lamps.

According to another embodiment, an AC/DC LED chip is mounted on a submount, and a passive protection circuit, which may include a resistor, a capacitor, a metal oxide varistor, a positive temperature coefficient ("PTC") thermistor, and/or other voltage surge protection devices, is integrated on the submount.

DETAILED DESCRIPTION OF THE INVENTION

Figure 1A:
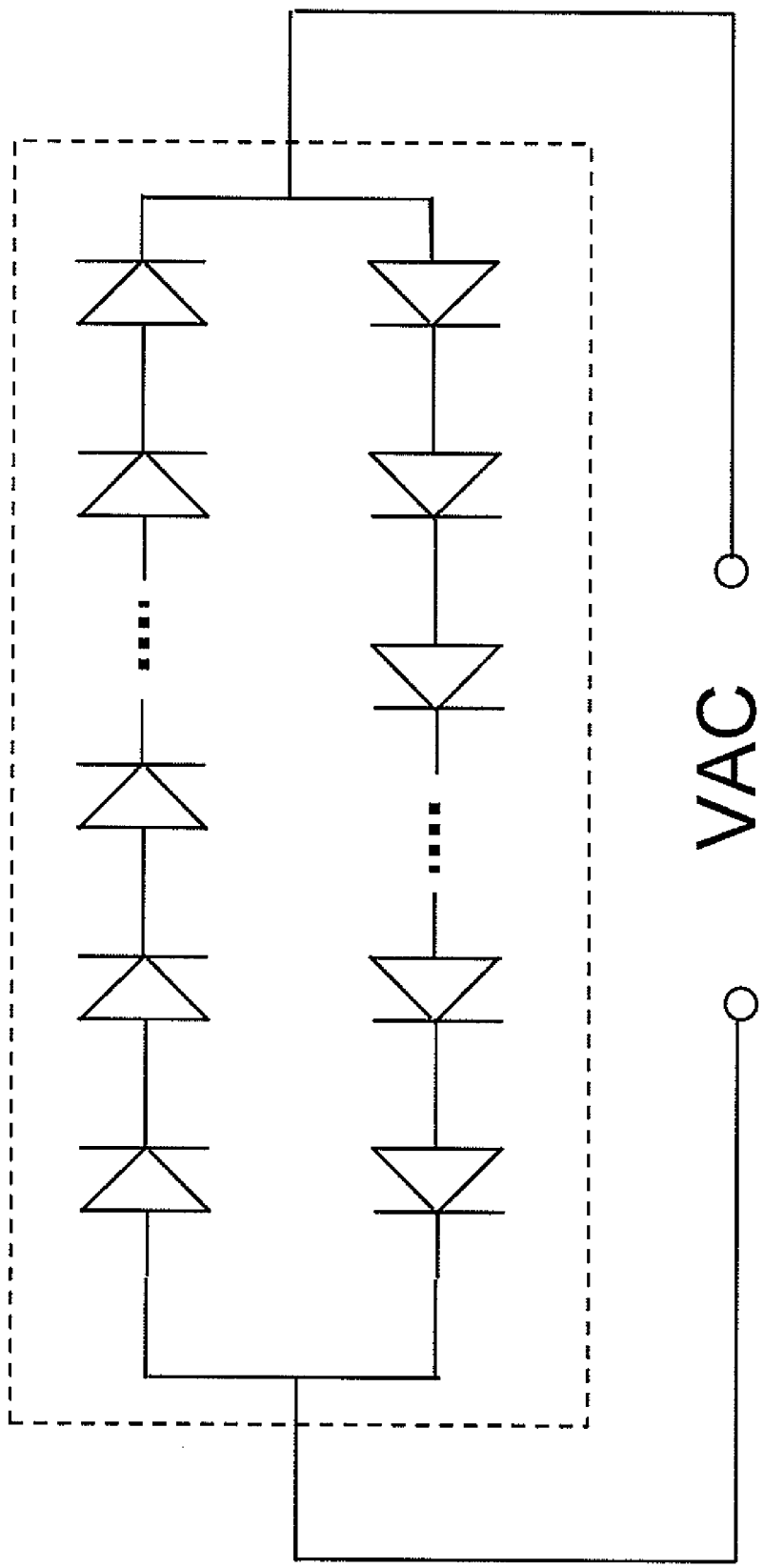
FIG. 1(a) shows a schematic for an embodiment of a prior art AC-LED with which embodiments of the present invention might be used.
Figure 1:
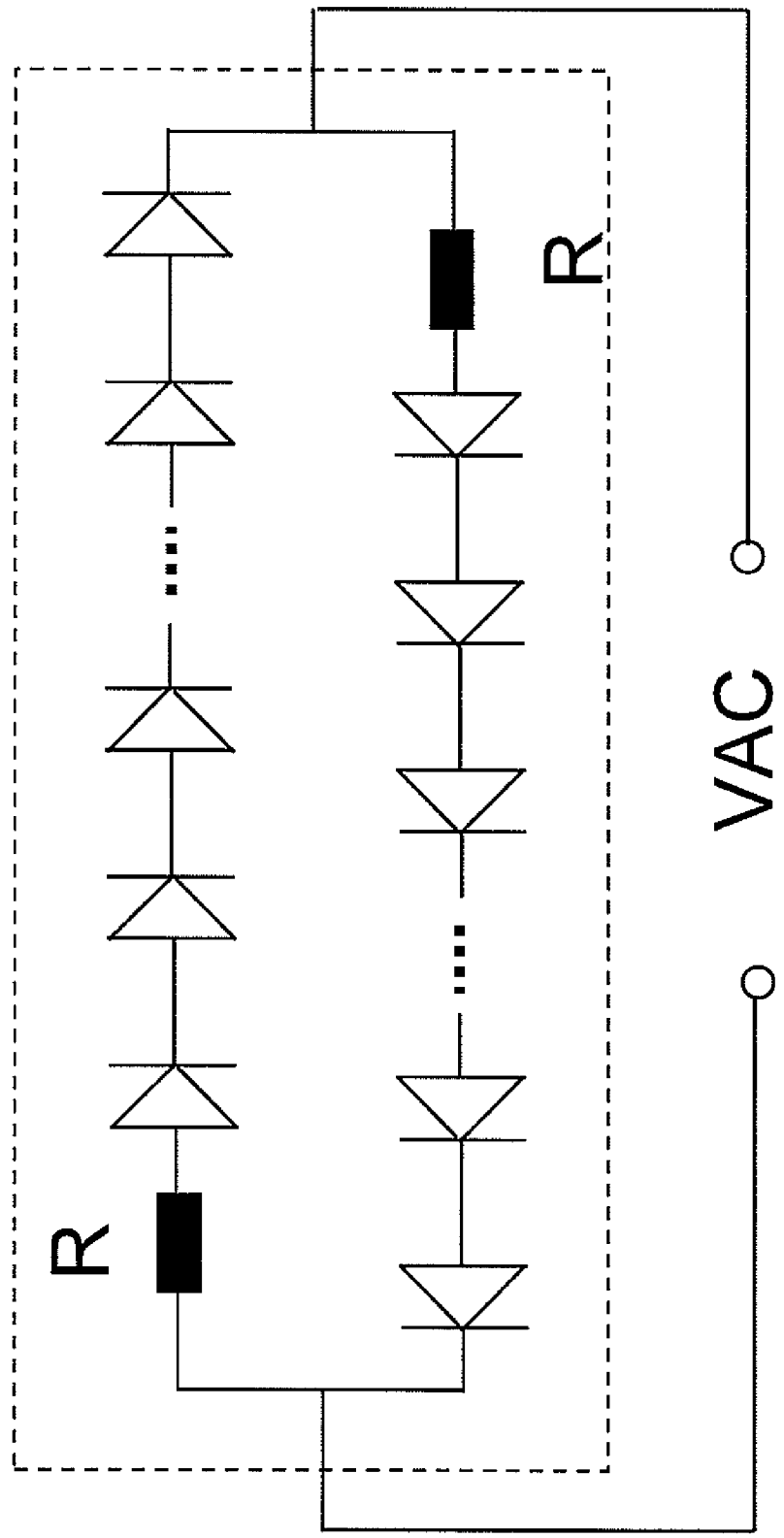
FIGS. 1(b), (c) and (d) show embodiments of the present invention used with monolithically integrated "lump" current-limiting resistors.
FIG. 1(e) shows an embodiment of the current invention used with monolithically integrated "distributed" current-limiting resistors.
Figure 1:
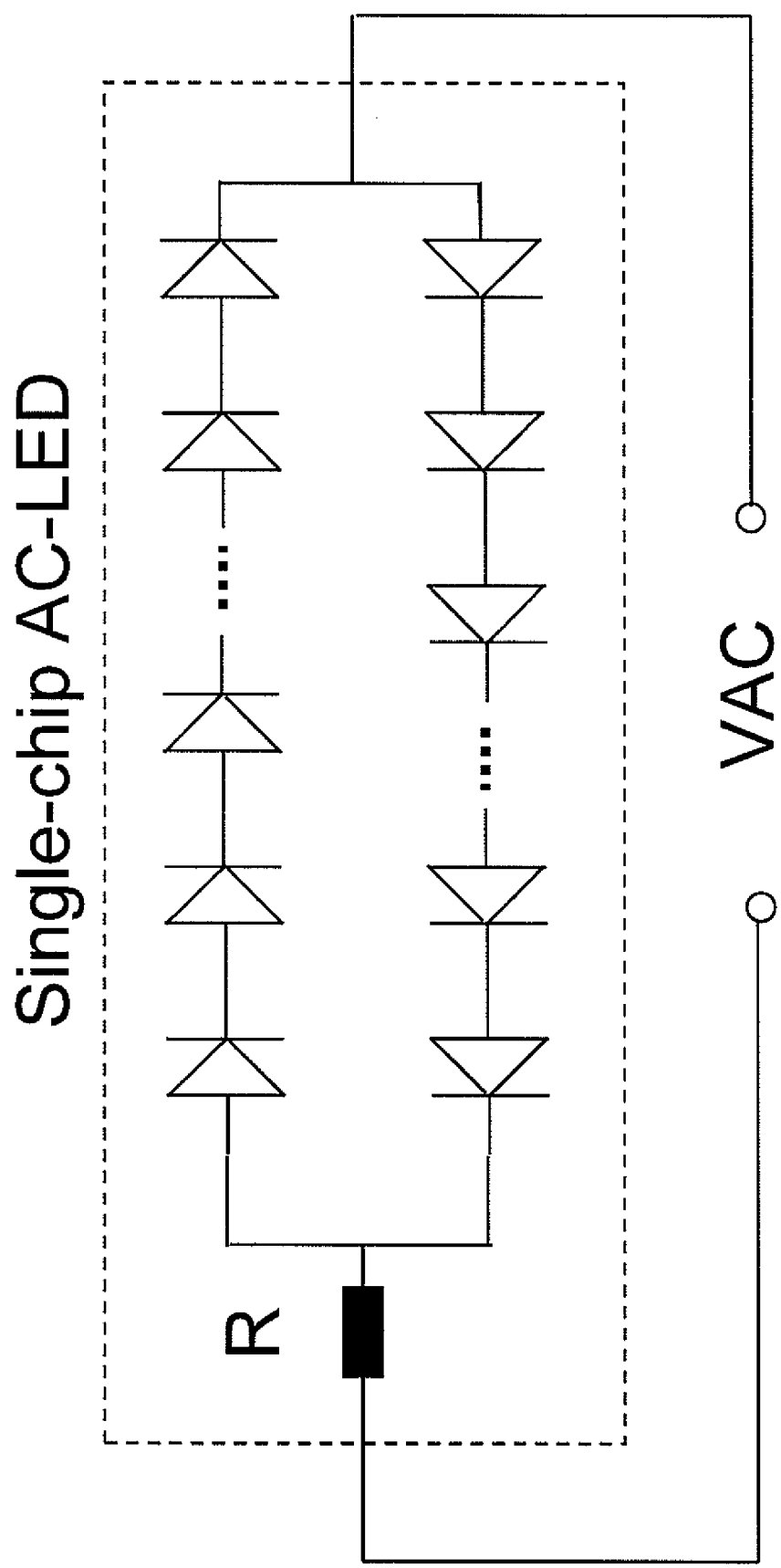
Figure 1:
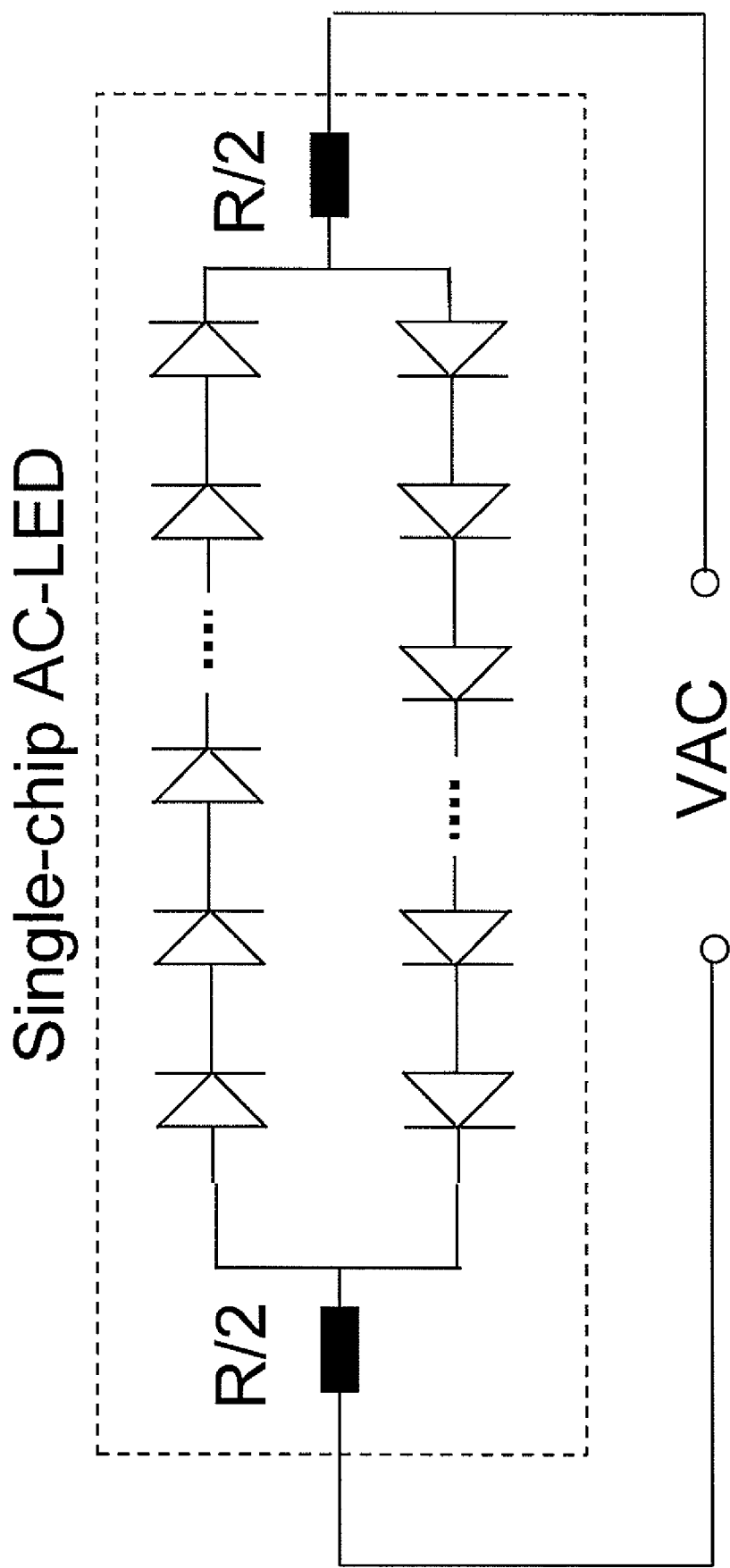
Figure 1:
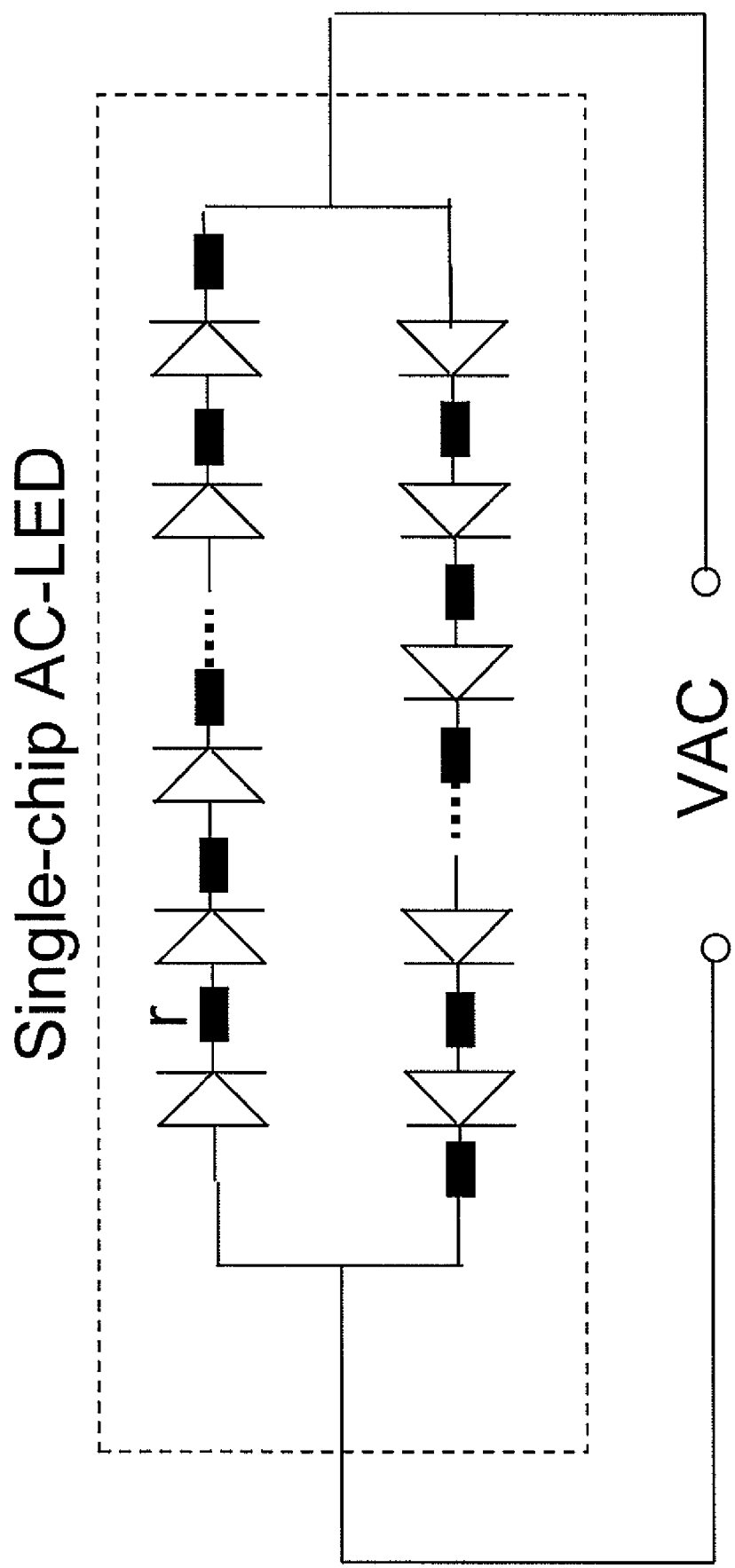

In recent history, improvements have been made over the conventional LEDs. The traditional LEDs could only be run under a very low DC voltage (roughly between 1V to 5V depending on the semiconductor materials used). But recently this limitation has been overcome. For example, commonly-owned U.S. Pat. No. 6,957,899, the contents of which are hereby incorporated by reference, discloses a single-chip AC-LED. The '899 arrangement discloses the integration of many mini-LEDs onto a common chip in series to achieve a light-emitting device which can be run under a high AC or DC input voltages directly. Depending on the number of LEDs incorporated, the running voltages applied can be 6V, 12V, 24V, 48V, 110V, 240V DC, or even higher. Furthermore, using two alternating current paths, the high voltage light emitting device can also run directly under 100V, 110/120V or 220/240 VAC line voltage, or 6 VAC, 12 VAC, 18 VAC, and 24 VAC.

There are essentially two main categories of applications for high voltage AC/DC LEDs. One traditional application is for signage and indicator lamps. These applications do not require high brightness. Developments have been made in this technological area. For example, commonly owned U.S. patent application Ser. No. 11/102,273 (the contents of which are hereby incorporated by reference) discloses AC/DC indicator lamps which are based on micro-size LEDs (see, e.g., U.S. Pat. No. 6,410,940) which integrates dozens to hundred of micro-size LEDs (MicroLEDs) into an area of a single standard LED device and has a similar power consumption (hereinafter referred to as "AC indicator LED"), so the AC indicator LED chip can be packaged in the standard T1, T1-¾ and other LED lamp packages for signage and indication applications.

With respect to chip size, the range for use for indicator lamp purposes is in the range of 0.5 by 0.5 to 0.2 by 0.2 millimeters. In the preferred embodiment, these chips are about 0.4 by 0.4 millimeters for use in a T1-¾ package, correspondingly, the individual MicroLEDs used for these indicator-lamp types of applications can range in size from about 50 by 50 to 20 by 20 microns. In the preferred embodiment, the MicroLEDs used are about 30 by 30 microns. Other types of packages exist in which AC indicator LEDs can be used as well. One skilled in the art will recognize that the chip size and MicroLEDs size will vary based on the particular package arrangement selected and the number of MicroLEDs depends on the voltage requirement.

The second other category of application is for illumination and lighting. But these applications require LEDs which provide more brightness and require higher power. (These LEDs are hereinafter referred to as an "AC power LEDs"). In commonly owned U.S. patent application Ser. No. 11/040,445 (the contents of which are hereby incorporated by reference), an AC power LED is heterogeneously integrated onto a submount, and the wire connections between the individual mini-LEDs are formed on the submount. In commonly owned application Ser. No. 11/144,982 (the contents of which are hereby incorporated by reference), a plurality of AC power LED chips are integrated onto one submount to form a large area AC/DC emitter to provide high power and brightness for lighting purposes.

The chip-size of AC power LED is determined by the power level and line voltage. Since all the packages are custom-designed, there is no strict size limitation, correspondingly, the mini-LEDs used for these AC power LEDs are somewhat larger. The individual mini-LEDs used for these high-voltage applications can range in size from about 0.1 mm by 0.1 mm to 0.5 mm by 0.5 mm or even larger. In a preferred embodiment of a 1 W AC power LED arrangement has a chip size of about 1 mm by 1 mm. But one skilled in the art will recognize that the sizes for the mini-LEDs and chips will vary based on power design and voltage design. Therefore, specific sizes and mini-LEDs number should not be considered limiting unless specifically claimed.

The development of these integrated single-chip-AC-emitters which run under high AC voltage presents new paradigms for LED applications in lighting, indication and displays. For example, the high-voltage AC light emitters can be directly powered by a standard 120 VAC power line (the most readily available power specifications in the United States and other locations) without the use of any voltage transformer. If the AC-LED is packaged with a standard Edison or European screw base, it can be directly screwed into the light bulb fixture, or plugged into the power outlet for lighting.

Problematic in these pursuits, however, is that the AC line voltages in utility power grids have considerable broad variation ranges. In US and Canada, e.g., the commonly referred to 120 VAC line voltages in truth will vary between 108 VAC and 132 VAC. It has been discovered that these variations, although endurable by conventional lighting arrangements, can cause catastrophic failure in the newly developed AC/DC LEDs. This is because the current flowing through light emitting diodes, in general, increases exponentially with applied voltage. Without suitable current limitations and protection, the reliability and lifetime of the previously disclosed AC/DC LEDs will be significantly reduced by the line-voltage variations.

In order to overcome the problems caused by these formerly uncontrolled voltage variations, a high voltage AC/DC LED arrangement is disclosed which improves device reliability and durability by incorporating one or more current limitation and protection mechanisms.

Generally speaking, this has been accomplished by integrating a protection element (e.g., a resistor) with the ACLED in a manner in which it is able to provide voltage/current surge protection without the need to incorporate some other means of surge protection into the device. Thus, the combined ACLED/protection element integration is able to be packed in a package to form a completely included illuminator which is adequately protected from over voltage situations or current surges.

The possible embodiments for this invention are many. Although the protection elements disclosed in most of the embodiments herein are resistors, it is possible that other devices or systems could be used instead which would provide the necessary protection against overvoltage and overcurrent situations. These alternative devices are also intended to be included within the meaning of "protection element" as used herein. Further, it is repeatedly discussed that the protection elements used are "integrated." The term "integrated" as used herein does not mean that the protection element component is integral with any other component of the device unless otherwise specified. For example, in many instances the use of this term means the monolithic integration of protection elements and LED on the same chip, while in other instances the use of this term is intended to impart only that the overall device is able to function as a unified whole. In some other instances the term means simply that the element is able to be easily packaged. This integration enables ACLEDs to be included in conventional package arrangements and replace traditional incandescent and other lighting technologies as never before. No separate surge protection circuitry needs to be provided, because the protection here is integrated.

In one embodiment, the resistor and the ACLED are fabricated on a same chip to form a monolithically integrated ACLED with protection.

In one of the monolithically integration embodiments, the resistor is built at the same time and using the same n-type semiconductor used in fabricating the ACLED. This can also be done using the p-type semiconductor material used to comprise the ACLED, an undoped semiconductor material in the ACLED, or even a combination of n-type, p-type, and undoped semiconductor materials during fabrication of the ACLED. These processes can be accomplished using LEDs based on (i) III-nitride semiconductors; (ii) III-V semiconductors (e.g., GaAs, InP, AlGaAs, AlGaInP); (iii) II-VI semiconductors, (iv) ZnO or SiC; (v) organic semiconductors; or (vi) polymer electroluminescent materials.

Alternatively, the resistor could be constructed using externally-deposited materials other than those for LED, and the materials are deposited on LED chip. For example, instead of using the materials used to construct the LED itself, separately deposed tantalum nitride, nichrome, or other resistive materials could be used instead. In these cases, the separately deposed resistive materials can be serially connected with the LEDs using wires on the same chip.

In another embodiment, the resistor and ACLED are serially connected through flip-chip bonding onto a submount. This embodiment could take many forms, but in one, the resistor is built on the ACLED chip, and in the other, the resistor is built onto the submount and then serially connected using wires on the submount. Additionally, resistors, a positive temperature coefficient ("PTC") thermistors, varistors, and capacitors, and or combinations could be electrically included into this type of arrangement.

In another embodiment, the resistor and ACLED are built on two separated chips and the integration is formed by wire bonding to connect the resistor with the ACLED somewhere in the package of illuminator.

Ideally, but not necessarily, the resistance created will be more than 1K ohm for indicator LED running at a normal current less than about 1.5 mA. In preferred embodiments, however, the resistance provided should be in the range of from about 10 K ohms to 30 K ohms for indicator LED running at a normal current less than about 1.5 mA. For power AC-LEDs running at higher currents, the preferred resistance value will depend on the driving current. For example, for power AC-LEDs running at a normal 20 mA with the power grid voltage variation of 30V, the preferred resistance value will be about 1.5 K ohms. It is certainly possible that lower and/or higher resistance could be used and still fall within the scope of the present invention, however.

For indicator and other low-power lighting applications, the processes of the present invention enable the user to create ACLED devices having a total size of less than about 0.5 mm by 0.5 mm. Devices this small are able to be packed in T1, T1¾ and other packages for low-power applications, and because of the integrated protection element(s) are able to function without falling victim to power variations existent in commercial power sources.

For high-power lighting applications, for example, commercial lighting on 110V or 220V, these processes enable the user to create devices having total sizes of more than 0.5 mm by 0.5 mm. These arrangements usually use larger and more LEDs to generate more light, while consuming considerable power. Because of the processes disclosed herein, a protection element (e.g., resistor) is able to be easily incorporated within a high-power lighting package and provide desired performance without failing due to power fluctuations.

Embodiments of the invention are described herein below by reference to the corresponding drawings.

FIG. 1(a) shows an AC-LED without any protection elements as disclosed in some earlier co-owned applications. FIGS. 1(b), (c) and (d) each illustrate the invention with different embodiments where the integrated protection elements are current-limiting resistors integrated on AC-LED chip. These resistors are fabricated at the same time as the AC-LED itself. With respect to the embodiment shown in FIG. 1(b), in each of the two alternating current paths, a resistor (R) is in serial connection with the corresponding LED string. In the preferred embodiment, the resistor used is what is commonly referred to as a current-limiting resistor. In FIG. 1(c), one current limiting resistor (R) is connected with the two current paths. In FIG. 1(d), two resistors (R/2+R/2=R) are used to facilitate device design. It should be noted that the position of the resistor can be anywhere in the device. The selection of resistor value (R) depends on the AC/DC LED working currents, voltages, and package/applications. It should be noted that the scope of the invention is not limited to the particular resistor positions or values disclosed here. Further, it is also within the broad objectives of the claimed invention that other devices could be used instead. For example, besides these examples using "lump" resistors, the current limiting resistors may also be constructed from small "distributed" resistors. FIG. 1(e) shows one embodiment where these smaller distributed resistors are deposed such that they are linked with each individual small LED of the AC/DC LED.

It should be understood that, although the LEDs shown in all the above, and hereinafter embodiments might be fabricated such that they emit white, blue, green, yellow, red, and other visible light. And the arrays created could be color homogenous, or mixed. Further, the LEDs could be adapted such that they emit infrared or ultraviolet wavelengths and still reap the benefits of the claimed invention. Thus, a particular emission-type of LED is not restrictive of the technological advances disclosed.

For AC indication LED lamps in standard T1, T1-¾, and other packages, the designed power consumption is typically from 40 mW to 120 mW, with a maximum power consumption of about 150 mW, limited by the thermal dissipation capability of such package. As one example, in the United States, the standard line voltage is 120 VAC, and the AC indicator LED lamp with a standard T1-¾ package has the maximum current of about (or no more than) 1 mA. Since the current flowing through the LED exponentially increases with applied voltage, without any current limiting protection, when AC voltage drifting to 130V, the current flowing through the 120V rated AC-LED lamp will be significantly increased, and the input power will be several times higher than the maximum limitation; the AC-LED lamp will be destroyed in a very short time by heating effect. When a current-limiting resistor with a resistance of about 10-30 k ohm is connected in series with the AC-LED, the current is limited to less than 1 mA at a maximum line voltage of about 130 VAC, and the lamp life-time will be significantly increased and will be comparable to that of the conventional DC LEDs.

For general lighting applications, an AC power LED runs at much higher current (20 mA or more), depending on the thermal dissipation capability of the package. Under these circumstances, the use of a current-limiting resistor is even more important for durability purposes.

Figure 2:
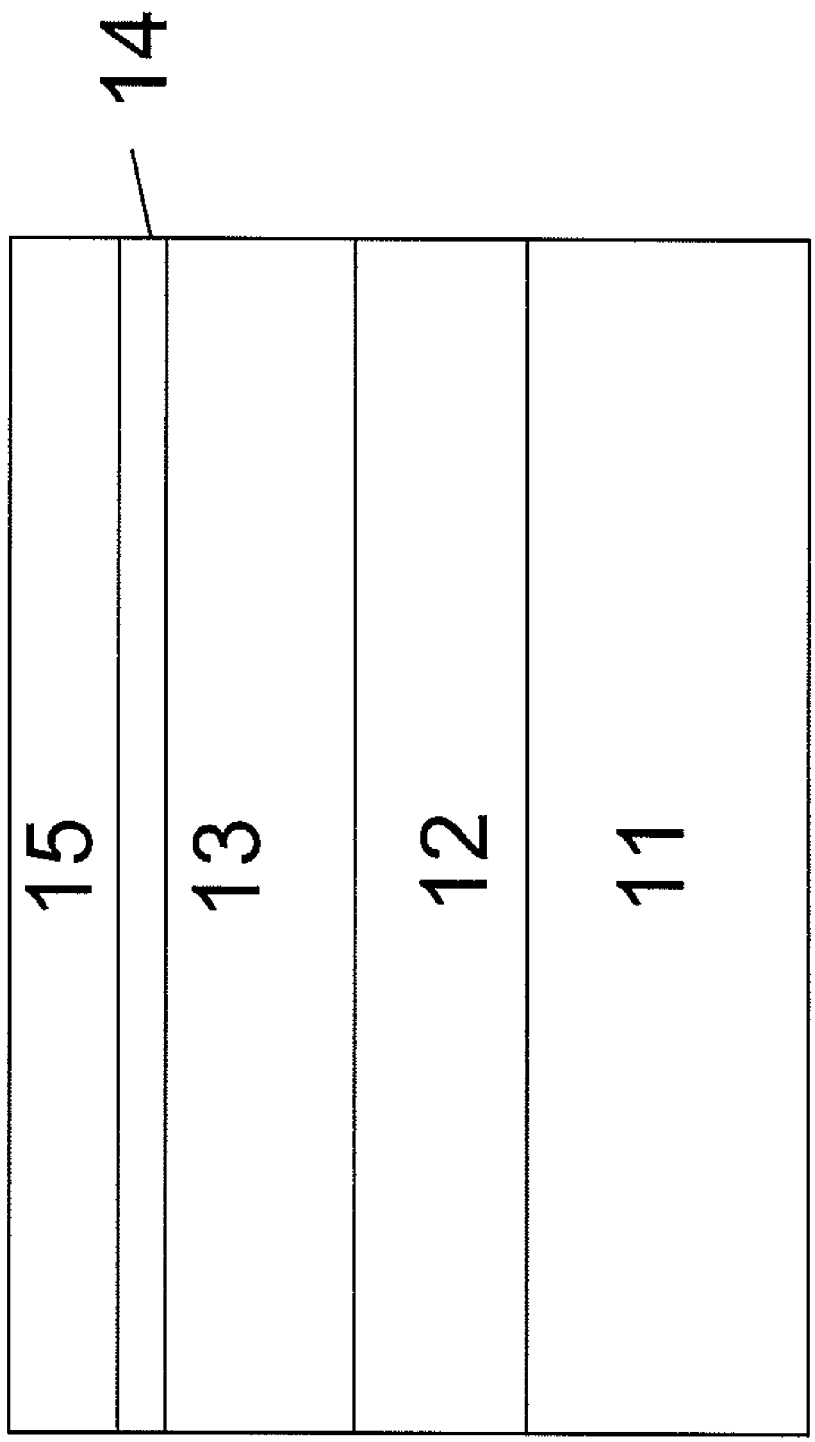
FIG. 2 Cross-section view of an LED wafer material layer structure for one embodiment of the present invention.

To this end, there are several embodiments which monolithically integrate the current-limiting resistor directly on the LED chip using n-type semiconductor, p-type semiconductor, un-doped semiconductor, insulative semiconductors, and their combinations or other materials, including externally deposited materials, to fabricate the resistor. The broad concepts of the present invention are useable with numerous semiconductor materials. Although the disclosed embodiments are directed to AC-LEDs based on III-nitride semiconductors, (e.g., GaN, InN, AlN, and their alloys AlGaN, InGaN, AlGaInN), which can be used for both AC indicator LEDs and AC power LEDs. The same concepts, however, would apply equally as well for numerous other semiconductor arrangements. For example, similar protection arrangements could also be used for AC-LEDs based on other semiconductors, such as III-V semiconductors, including GaAs, InP, AlGaAs, AlGaInP, and other semiconductors such as SiC and ZnO. The use of different organic semiconductors and/or organic electroluminescent materials or polymer electroluminescent materials is also a possibility. Therefore, the broad aspects of the present invention should not be restricted to the use of any particular semiconductor material Referring to FIG. 2, AC-LED fabrication starts from the epitaxial wafer structure. The wafer includes an insulating substrate (such as sapphire), or an insulating layer deposited on a conducting substrate (such as Si, SiC or other substrate material) (11), an un-doped GaN layer (12), a Si-doped n-type GaN layer (13), a multi-quantum-well optical active region (14), and p-type GaN layer (15). Because of the intrinsic properties of the materials, the un-doped GaN layer 12 has n-type conductivity, but its conductivity is much lower than that of the intentionally doped GaN layer 13. Typically, layer 12 has a resistance of 0.1 to 1 Ω·cm, and layer 13 has a resistance of 0.003 to 0.03 Ω·cm. The combination of layers 12 and 13 is generally referred to as an n-GaN layer. It is well known that when GaN is grown on a substrate, a very thin amorphous layer with ~25 nm is first grown at low temperature (~550° C.), then annealed at high temperature (>~950° C.) to form polycrystal as nucleation layer, following is the growth at high temperature of a thick GaN layer (>~2 μm) as the buffer, so that the defects can be gradually reduced as the film becomes thick and single crystal is formed. Upon this buffer, the crystal thin-film epi-layers of the LED structure, including n-type layer, multi-quantum-well optical active layers, and p-type layer can be gown with high crystal quality. Here we broadly call the amorphous/polycrystal nucleation layer and buffer layer as undoped GaN layer (12).

Figure 3:
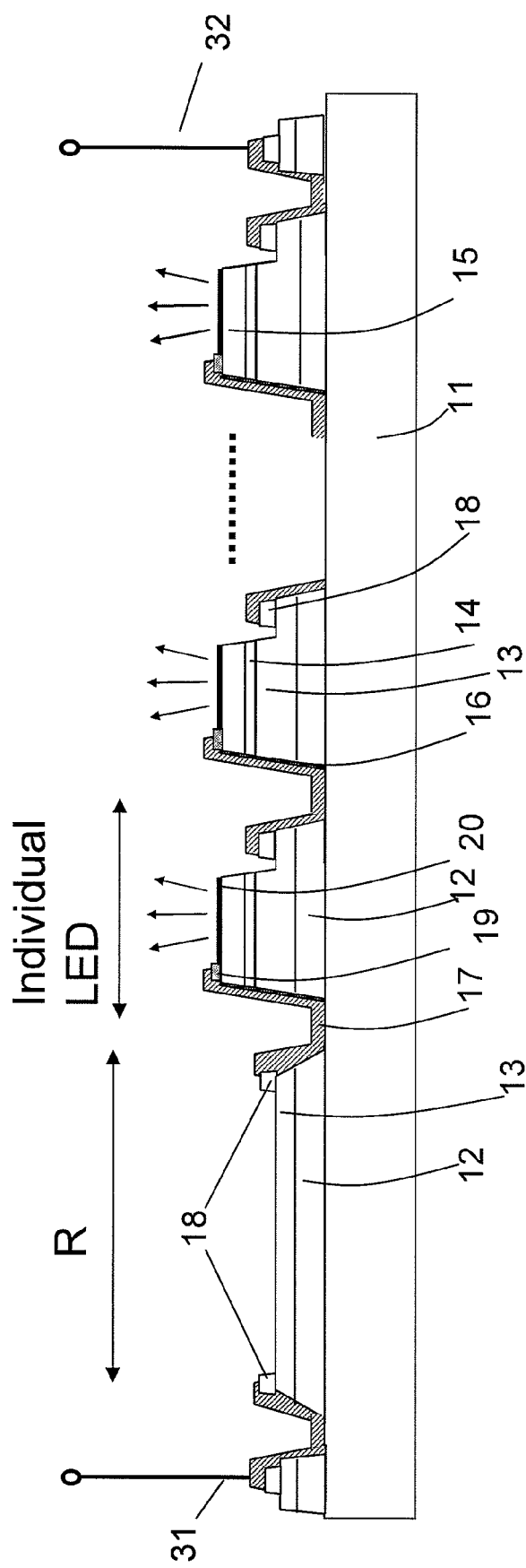
FIG. 3(a) shows a cross-section view of an embodiment of the present invention having a monolithically integrated resistor fabricated from doped n-GaN material in serial connection with the LED array through deposited wires on the chip.
FIG. 3(b) shows a cross-section view of an embodiment comprising a monolithically integrated resistor which is fabricated from doped n-GaN material in series connection with an LED array through bumps which make electrical connection through wires disposed on a submount.
FIG. 3(c) shows a cross-sectional view of an embodiment in which a monolithically integrated resistor fabricated from doped n-GaN material is oriented in serial connection with an LED array through n-GaN material.
FIG. 3(d) shows cross-sectional view of an embodiment having a monolithically integrated resistor which is fabricated from doped n-GaN material and caused to be in serial connection with an LED array through bumps which make electrical contact through wires on a submount.
FIG. 3(e) shows a top-view of an embodiment in which a "lump" resistor strip with compact zigzag geometry is utilized.
FIG. 3(f) shows a top-view for an embodiment in which "distributed" resistors are linked with each individual mini-LED.
Figure 3:
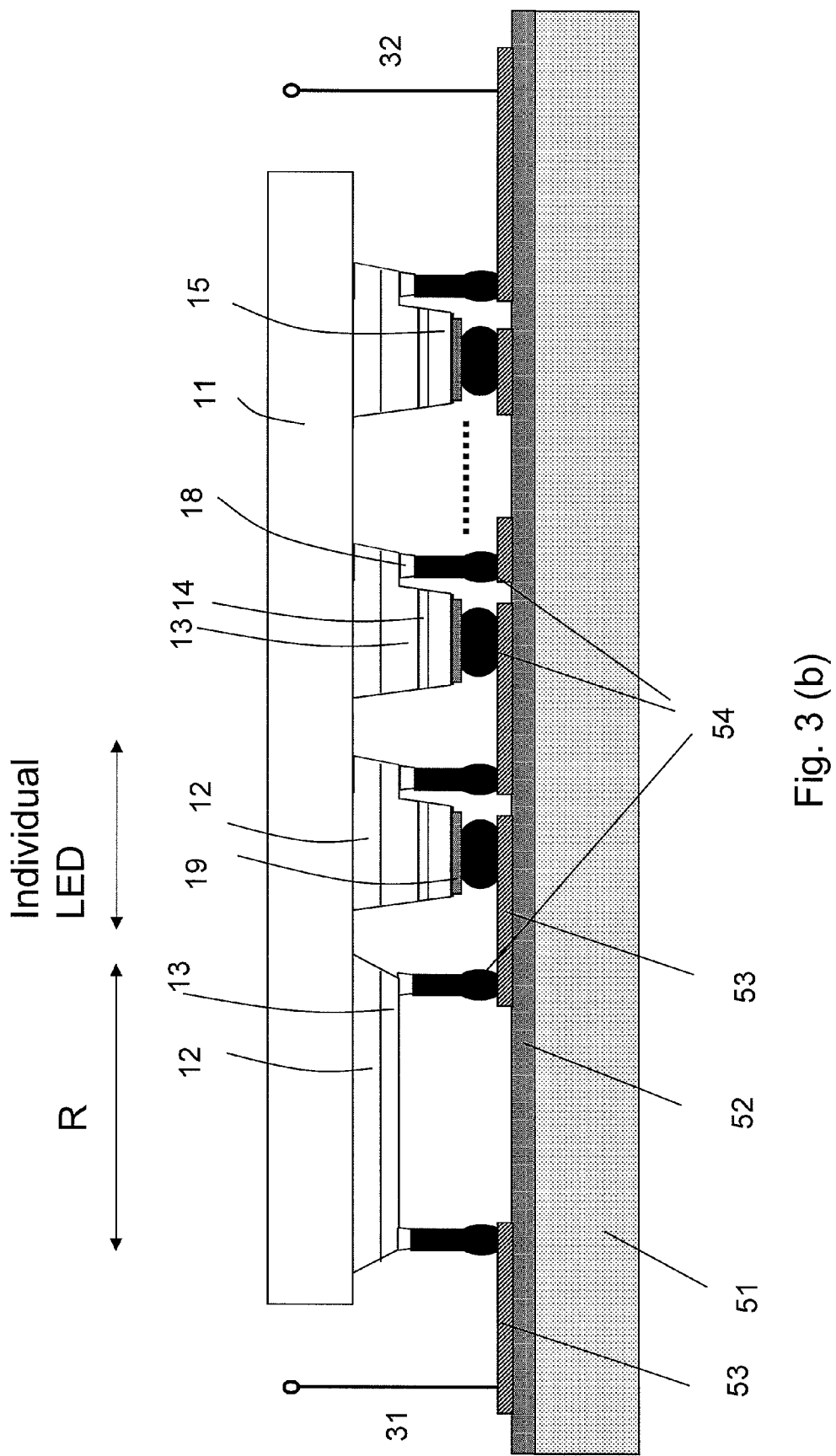
Figure 3:
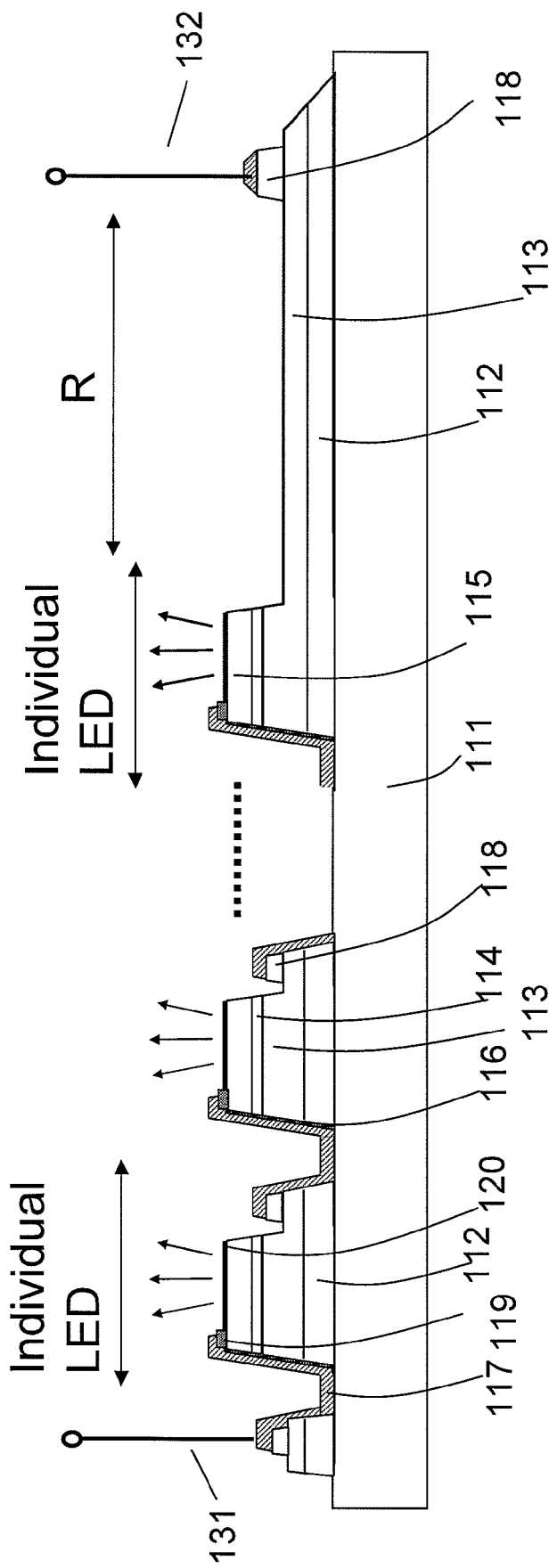
Figure 3:
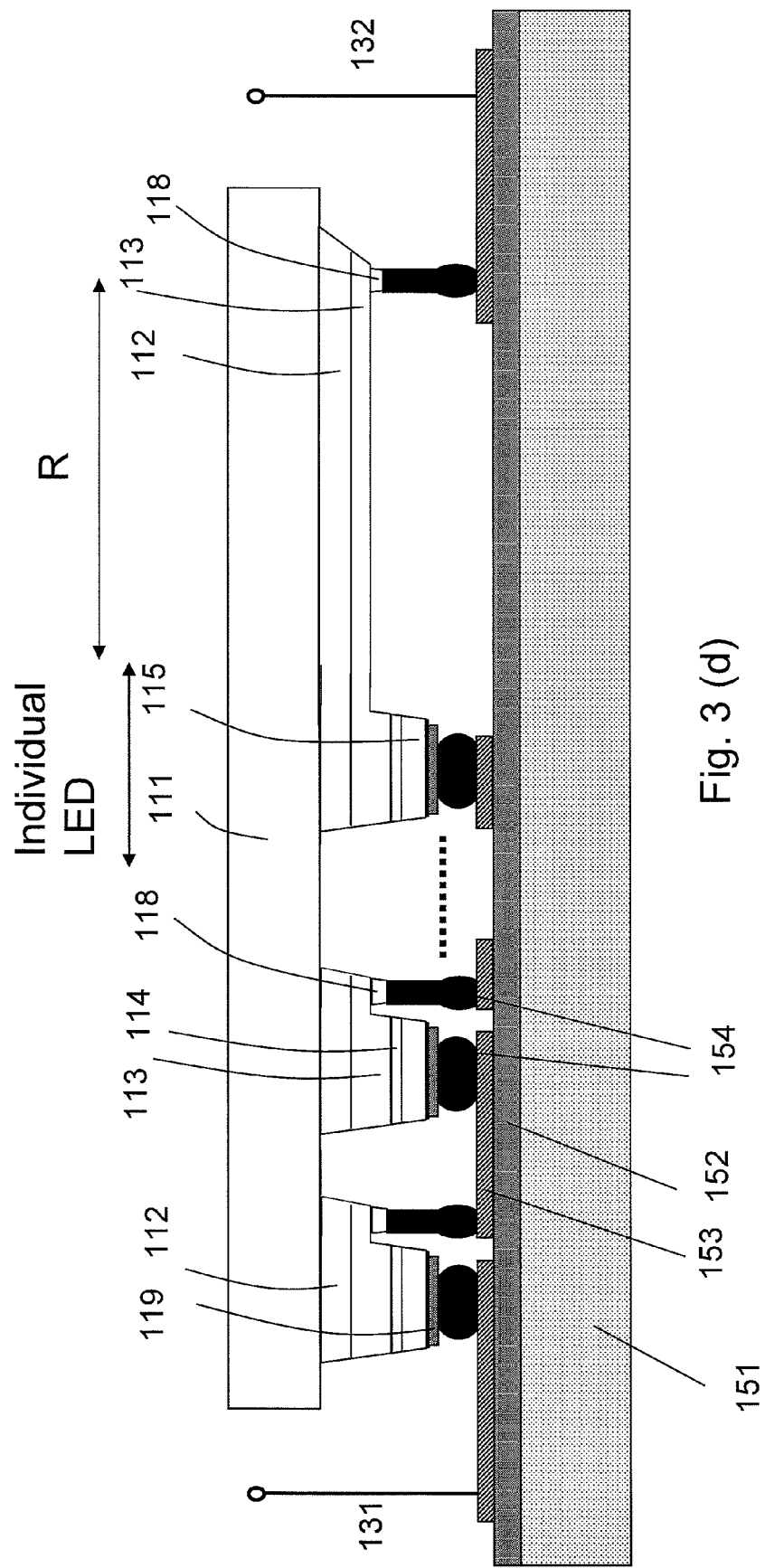
Figure 3:
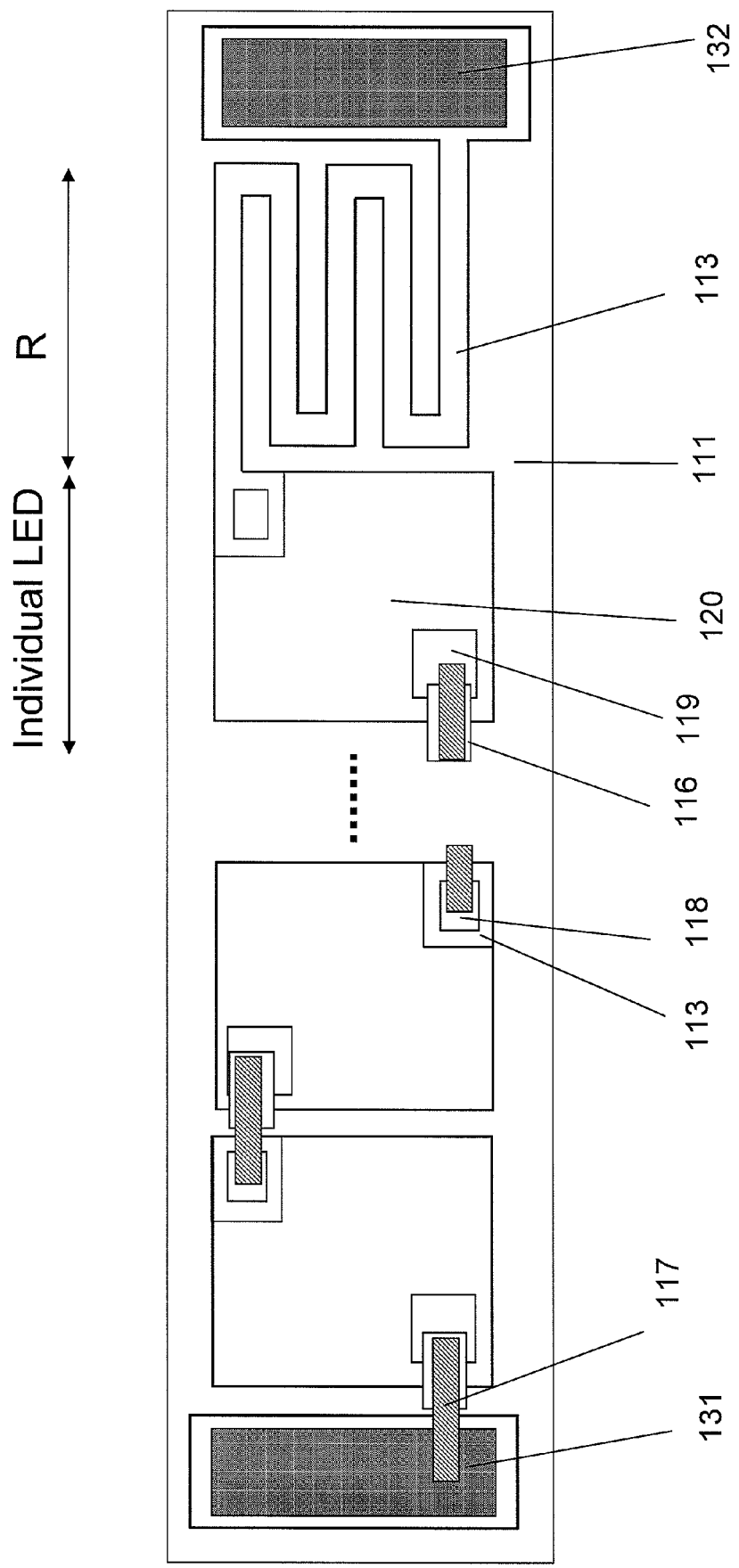
Figure 3:
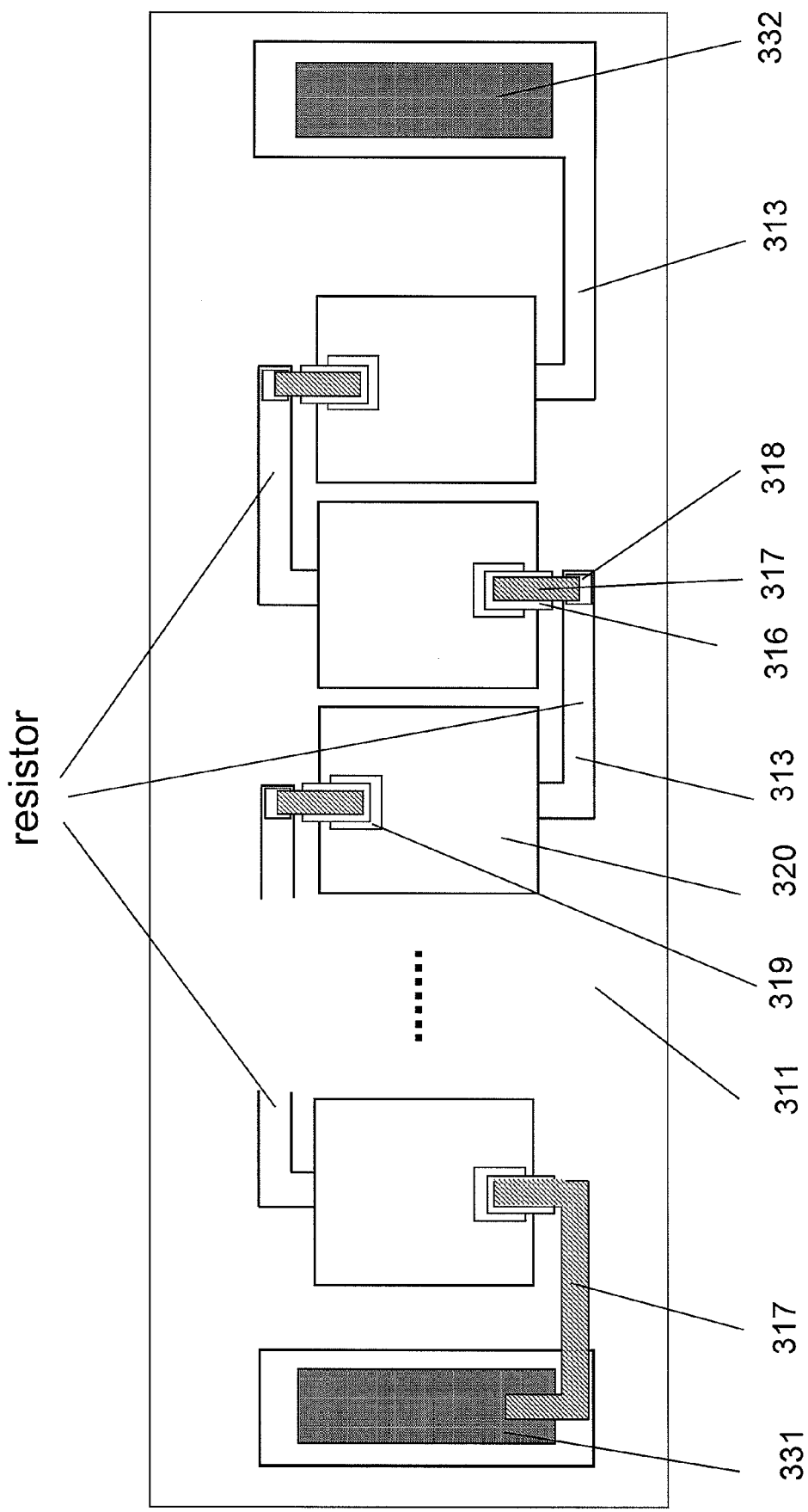

In a first embodiment, the doped n-type semiconductor material of LED is used to fabricate the resistor with a designed resistance value. Referring to FIG. 3(a), the wafer is first etched to n-GaN layer 13 to expose doped n-GaN, and then etched to insulating substrate 11 to isolate each individual LED. Current spreading layer 20, p-contact 19, and n-contact 18 are formed by metal deposition. Next, an insulation material 16 is deposed on the etched sidewall, and then metal line 17 is formed to serially connect individual mini-LEDs (micro-LEDs) to form one AC-LED. To monolithically integrate the current-limiting resistor by using doped n-GaN layer 13, during the first etching step down to the doped n-GaN layer 13, the etching depth is controlled so that about 0.5-2 μm doped n-GaN layer 13 remains. In the second etching step down to the insulating substrate, n-GaN strip with certain geometry is formed. After two n-contacts 18 deposited on the two ends of GaN strip, one end is connected with power input, and the other end is connected with the p-contact of first individual mini-LED (micro-LED) of AC-LED, a lump current-limiting resistor (R) is then integrated into the LED array. Electrical potential is made available using a first electrical electrode 31 and a second electrode 32 in a manner known to those skilled in the art. The lump resistor value depends on the fabricated doped n-GaN strip geometry and its resistivity.

The resistor value should be adapted to meet requirements. The resistance necessary can be created by controlling the geometries of the strip created according to the formula:

$$R = \rho \frac{A}{L}$$

where R is the resistance; ρ is the resistivity of the particular material used; A is the cross sectional area of the strip deposed; and L is the length of the strip. For a typical rectangular cross section shape strip, A=W·H, where W and H are the cross sectional width and height of the strip; thus, it may be seen that by manipulating strip cross sectional area (or width and height) and length in a manner most convenient to the particular device, the resistor is able to be monolithically incorporated into the device in a variety of ways. In one embodiment, doped n-GaN, which has a typical resistivity of 0.01 Ω·cm, is geometrically deposed to achieve a resistor of 10 kΩ. Considering it is deposed to have a thickness (or height) of 1 μm, the ratio of strip length over width will be 100:1. If the strip has a width of 5 μm, its length will be 500 μm. This strip may be a straight one, or it may have a complex shape, such as zigzag shape, so the strip can be limited in a compact region. One skilled in the art will recognize that numerous other geometric configurations could be used to achieve the same objectives. Although doped n-GaN is disclosed as the preferred semiconductor material used in FIG. 3(c), it is also possible that other materials could be used instead or in addition. For example, the semiconductor materials used might include crystalline and/or amorphous structures. They might also comprise thin-films, including epi-layers and buffer layers. And in addition to n-type doped, the materials might be p-type doped, insulative-doped, un-doped semiconductor, and their combinations. And aside from III-nitride semiconductor GaN, the semiconductor might comprise different III-nitride semiconductors such as InN, AlN, and their alloys AlGaN, InGaN, AlGaInN, among others. Further, III-V semiconductors including GaAs, InP, AlGaAs, AlGaInP, or others might be used instead. And even semiconductor materials that are not III-nitride or III-V semiconductors could be used, including ZnO, SiC, and others. These semiconductor materials might be organic semiconductors and/or organic electroluminescent materials. Further, they might be polymer electroluminescent materials. It should be understood that in this, and all of the other like embodiments disclosed, the particular materials used should not be considered as limiting unless specifically claimed.

Referring to FIG. 3(b), an alternative environment for incorporation of the FIG. 3(a) LED is disclosed. Support for this type of flip-chip arrangement can be found in commonly owned U.S. patent application Ser. No. 11/040,445, which has already been herein incorporated by reference. The '445 application discloses an AC power LED which was heterogeneously integrated on a submount, and the wire connections between the individual mini-LEDs were formed on that submount. Employing these technologies here, FIG. 3(b) shows the addition of a lump resistor R constructed from n-GaN is also connected with the power terminal and a neighboring individual LED through bumps 54 and wires 53 on a submount. In the preferred embodiment, the submount has a metal base 51 covered with an insulation material 52. It should be understood, however, that the submount could take many forms depending on the circumstances. For example, submount could comprise polymer covered aluminum or copper. Alternatively, the submount could be based on Silicon, SiC, AlN, or other materials. By using this flip-chip arrangement, cross-trench deposed wiring (e.g., metal lines 17 in FIG. 3(a)) is unnecessary.

Referring to FIG. 3(c), another example to construct the lump resistor R from n-GaN is illustrated. Like with the earlier embodiments, the FIG. 3(c) LED fabrication includes a substrate 111, an undoped GaN layer 112, an n-type GaN layer 113, an active region 114, a p-type GaN layer 115, insulation material 116, a metal line 117, an n-contact 118, a p-contact 119, a current spreading layer 120, and electrodes 131 and 132. Here, however, resistor R and its neighboring individual LED are directly linked by doped n-GaN layer 113. Thus, protection mechanism R is integral with an extension of layer 113. Because of this, there is no need for a separate metal connection wire because the resistor R is also directly linked with the power terminal through n-GaN material 113. Like with the FIG. 3(a) embodiment, and all of the other embodiments herein, the materials used should not be considered a limitation unless specifically claimed. Although a doped n-GaN layer has been used herein, other materials like those described regarding the last embodiment could be used here as well and still fall within the broad concepts of the present invention.

A flip-chip bonded version is illustrated in FIG. 3(d). With the FIG. 3(d) version, the lump resistor R (comprised of extended n-type GaN layer 113) and each of the individual mini-LEDs are electrically connected with the power terminal and a neighboring individual mini-LED through bumps 154 and wires 153 on a submount. The submount, in the preferred embodiment, has a metal base 151 covered with insulation material 152. But as discussed already above, other submount arrangements are possible.

FIG. 3(e) is the top-view of FIG. 3(c), showing that the extended n-GaN layer 113 has been etched to have a zigzag shape. This zigzag shape increases the electrical travel distance through the n-GaN material 113. Because of this, the shape increases the resistance between contact 132 and current-spreading layer 120 to the desired level. One will recognize that the shape of layer 113 could be alternatively etched into any number of shapes; e.g., serpentine, straight; depending on the resistivity and other electrical specifications desired.

In contrast to FIG. 3(e), FIG. 3(f) illustrates another example to incorporate current-limiting resistors by constructing distributed resistors (r) instead of a lump resistor (R). The FIG. 3(e) embodiment, like with earlier examples, includes a fabrication including a substrate 311, an undoped GaN layer, an n-type GaN layer 313, an active region, a p-type GaN layer, insulation material 316, a metal line 317, an n-contact 318, a p-contact 319, a current spreading layer 320, and electrodes 331 and 332. Unlike in FIG. 3(e), however, with the FIG. 3(f) embodiment, each individual mini-LED of the AC-LED has a linked small resistor r which is comprised of n-type GaN 313, and the resistance offered by the sum of all these small resistors is adapted to equal the desired level of resistance. Thus, the sum of the individual distributed resistors could be configured to equal the resistance of lump resistor R (see FIG. 3(e)).

In an alternative embodiment (not shown), the doped p-type semiconductor material of the LED is used to fabricate the monolithic resistor Like with n-type GaN layer 113, p-type GaN strip 115 is defined with a certain geometry (length and width) during the first etching step (when it is etched down to the n-GaN layer). To accomplish this alternative structure, the two p-GaN contacts are formed at two ends of p-GaN strip, and the sidewalls are also isolated with insulation material. See, e.g., insulation material 416 in FIG. 4. With one end connecting with power input, and the other end connecting with the first individual LED, a current-limiting resistor is integrated into the LED array. The resistor value depends on the fabricated p-GaN geometry and its resistivity. For example, p-GaN has a typical resistivity of 2 Ω·cm, and a thickness of 0.25 µm. To achieve a resistor of 10 kΩ, the ratio of strip length over width will be 1:8. It should be realized that when the doped p-type semiconductor material, which is above n-type semiconductor, is used to fabricate the resistor; the voltage on the resistor has a limitation, determined by semiconductor p-n junction breakdown voltage. Like the resistors created by extending the n-type GaN materials (e.g., layer 113) as discussed above, the doped p-type materials (e.g., layer 115) could also be extended to create the resistance necessary.

Figure 4:
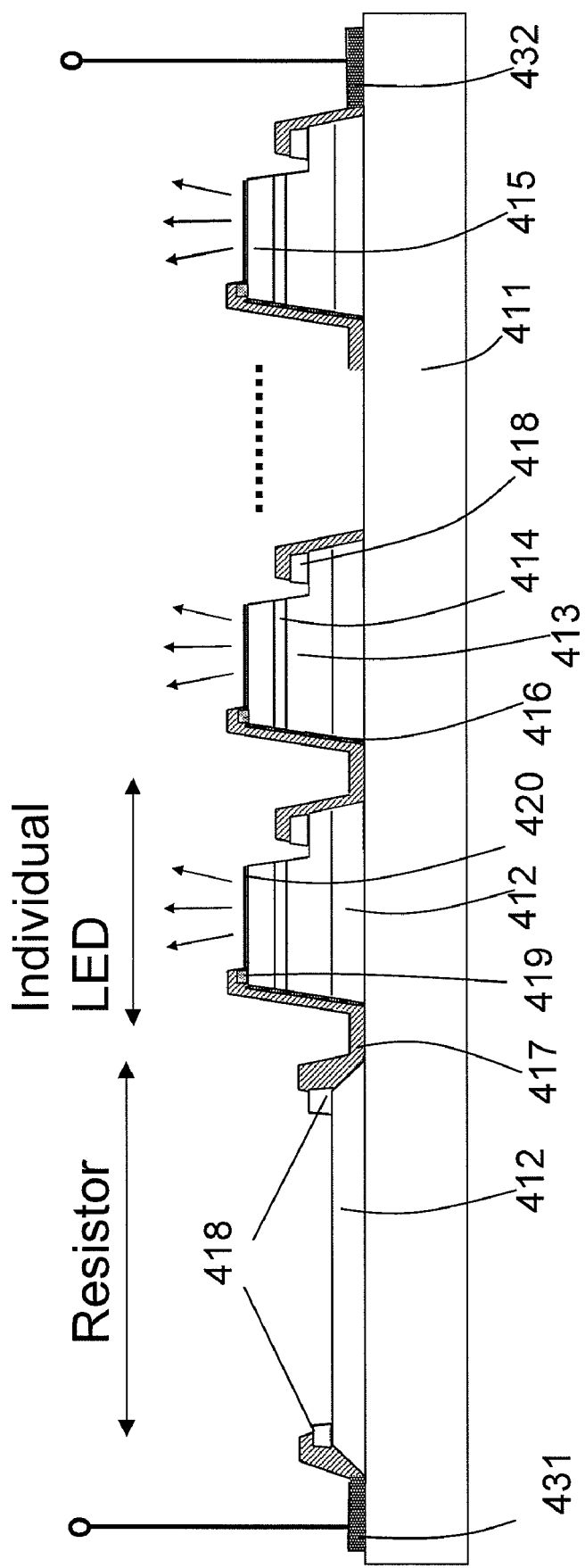
FIG. 4 shows a cross-section view of an embodiment using a monolithically integrated resistor fabricated from un-doped GaN material.

In another embodiment disclosed in FIG. 4, the un-doped semiconductor material of LED is used to fabricate the monolithic resistor. Like with past embodiments, the device includes a substrate 411, an undoped GaN layer 412, an n-type GaN layer 413, an active region 414, a p-type GaN layer 415, insulation material 416, a metal line 417, an n-contact 418, a p-contact 419, a current spreading layer 420, and electrodes 431 and 432. One more etching step is necessary for resistor fabrication. That step is to etch un-doped GaN layer 412 as disclosed in the figure. After two n-contacts 418 have been deposited on the two ends of the GaN strip, one end is connected with power input 431, and the other end is connected with the first individual mini-LED of the AC-LED, thus the resistor is connected in serial into the mini-LED strings (see FIG. 4). The resistor value depends on the fabricated un-doped GaN strip geometry and its resistivity. For example, un-doped GaN has a typical resistivity of 0.5 Ω·cm, and a thickness of 1 µm. To achieve a resistor of 10 kΩ, the ratio of strip length over width will be 1:2. Other geometric manipulations could be used as well and still fall within the scope of the present invention. It should be pointed out that here we illustrate the methods of fabricating a monolithically integrated resistor on the AC/DC LED chip by using the LED device structure materials (n-layer, p-layer, undoped layer, etc.), same methods can be used to fabricate the monolithically integrated resistor on other semiconductor devices, for example, transistors, laser diodes, detectors, by using these devices' structure materials. Furthermore, other monolithically integrated passive elements, inductor and capacitor can be fabricated.

Figure 5:
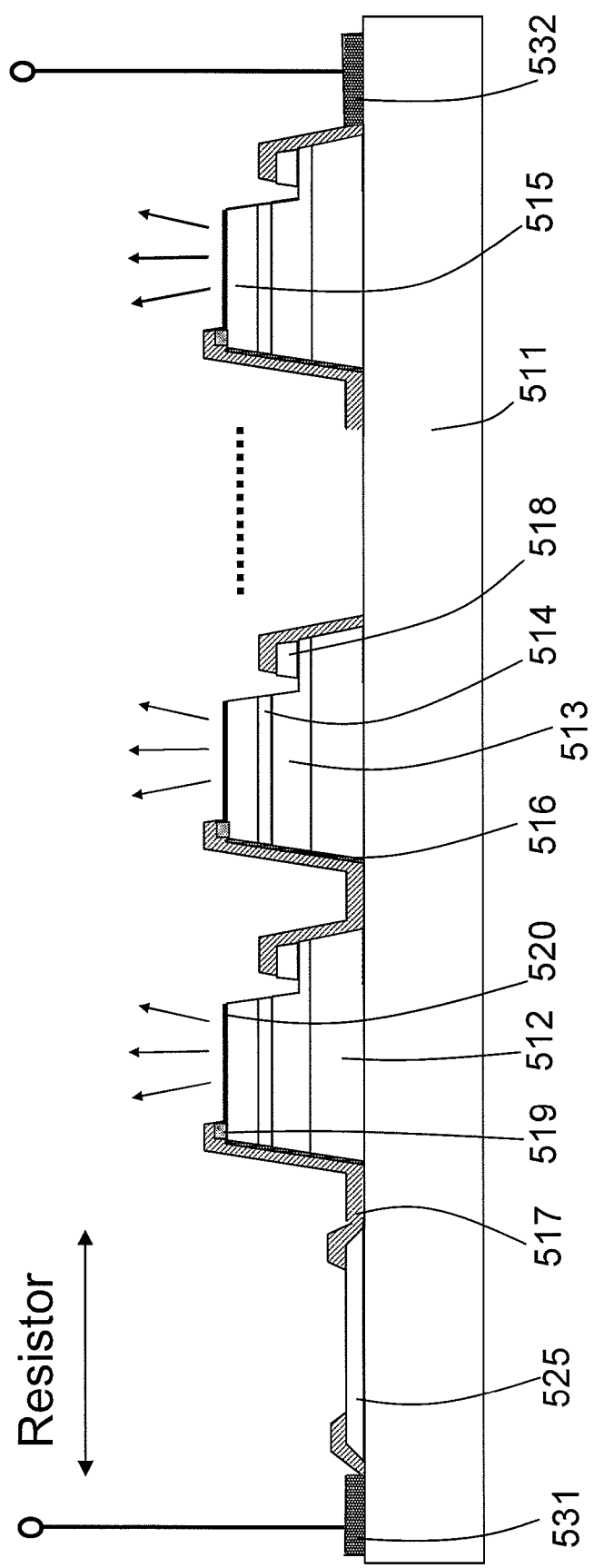
FIG. 5 shows a cross-section view of an embodiment including a monolithically integrated resistor fabricated from deposited thin-film material.

Yet another embodiment is shown in FIG. 5. Like with earlier embodiments, the FIG. 5 embodiment includes a substrate 511, an undoped GaN layer 512, an n-type GaN layer 513, an active region 514, a p-type GaN layer 515, insulation material 516, a metal line 517, an n-contact 518, a p-contact 519, a current spreading layer 520, and electrodes 531 and 532. This embodiment, however, includes a separately deposited current-limiting resistor 525 which is formed from deposited materials. These materials are deposited after etching down to the insulating substrate. After etching, a thin-film of certain materials, preferably tantalum nitride (TaN$_x$) or nichrome, is deposited with tens to hundreds of nanometers thickness and patterned into certain geometry to achieve the required resistance. One skilled in the art, however, will recognize that other resistive thin-film materials could be used as well and still fall within the broad concepts of the present invention. The sheet resistance of TaN, or nichrome is in the range of 5 Ω/square to 250 Ω/square, which can meet the requirements of current-limiting resistor. After conductive contacts have been formed at the two ends of resistor strip, the resistive material is typically thermally annealed for oxidation to stabilize the resistance. It should be noted that the resistive materials could also be deposited on an insulating layer which has been deposited on a conducting substrate.

Figure 6:
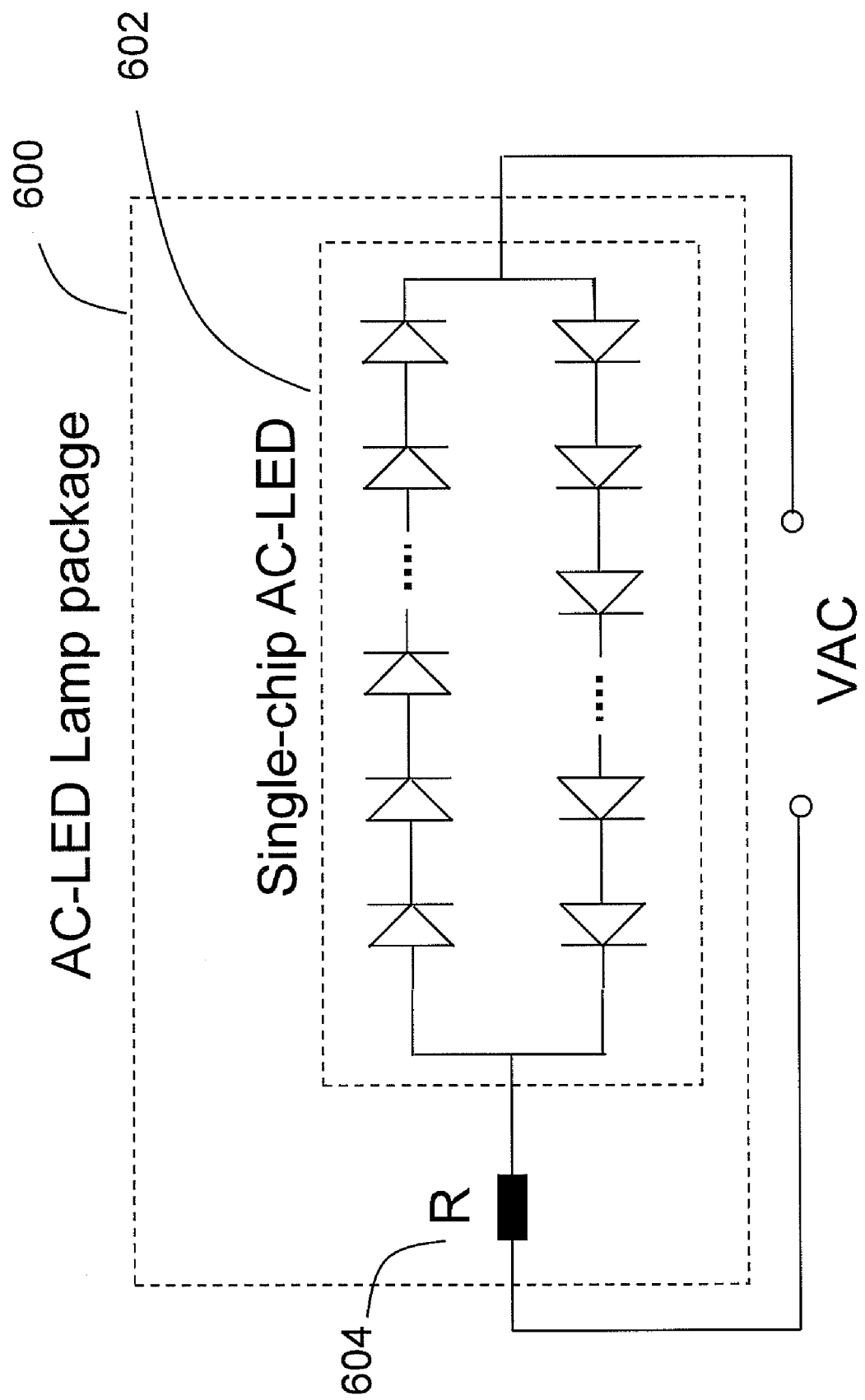
FIG. 6 shows an embodiment in which a current-limiting resistor is integrated with an AC/DC LED chip in a lamp package assembly.

In another approach, a discrete bare-chip resistor 604 is integrated with AC-LED chip 602 and included in a lamp package 600, as shown in FIG. 6. The lamp package may be a T1, T1-¾, or other standard or custom LED packaging arrangement, including surface mounting kinds of packages. The packaged AC-LEDs can be configured to require low power for indication applications and high power for general lighting.

Figure 7:
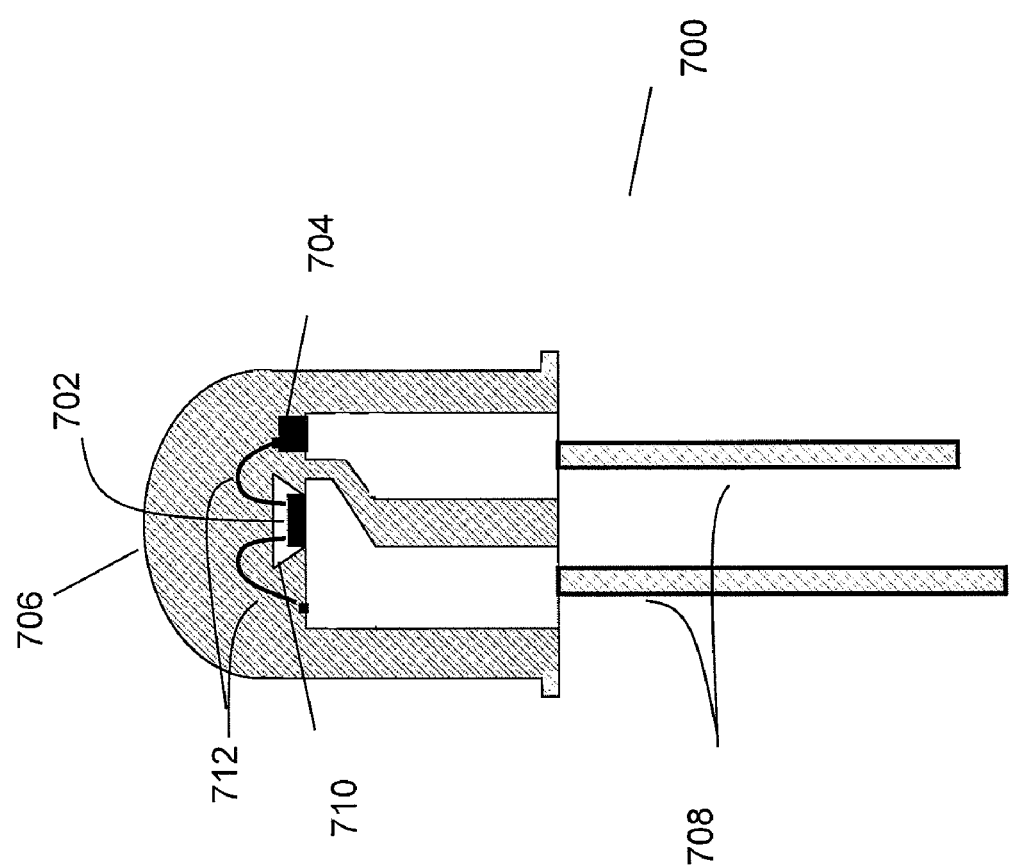
FIG. 7 shows an embodiment where a current-limiting resistor chip is integrated with an AC/DC LED chip in a standard T1-¾ lamp package and thus, is adapted to function as an indicator lamp.

FIG. 7 shows an example of these general principles applied to a standard T1-¾ package which can be used for indication applications. Here, a lamp package 700 is adapted to include a discrete bare-chip resistor 704 which is electrically connected with an AC-LED chip 702 using bonding wires 712. As one skilled in the art will recognize, standard package 700 also includes an epoxy dome lens 706, leads 708, and a reflector cup 710. Bare chip resistor 704 is provided with a suitable resistance to protect the AC-LED chip 702 from damage. Here it is shown seated on one lead of the package frame by silver paste or other solders. The chip resistor is electrically connected with this lead through its bottom contact. The AC-LED chip is seated in reflection cup 710. With wire bonding, one electrode of the AC-LED is bonded to the other lead of the package frame, and the other electrode of AC-LED is bonded to the top contact of the chip resistor 704. Thus, the resistor is made to be in a series connection with the AC-LED chip 702. Bare chip resistor 704 has a preferred dimension of about 20 mil by 20 mil or even smaller, for example, the thin film back-contact resistor (BCR) from the company of Vishay Electro-Films has a size 20 by 20 mil. This sizing enables chip resistor 704 to easily fit into the compact package.

Figure 8:
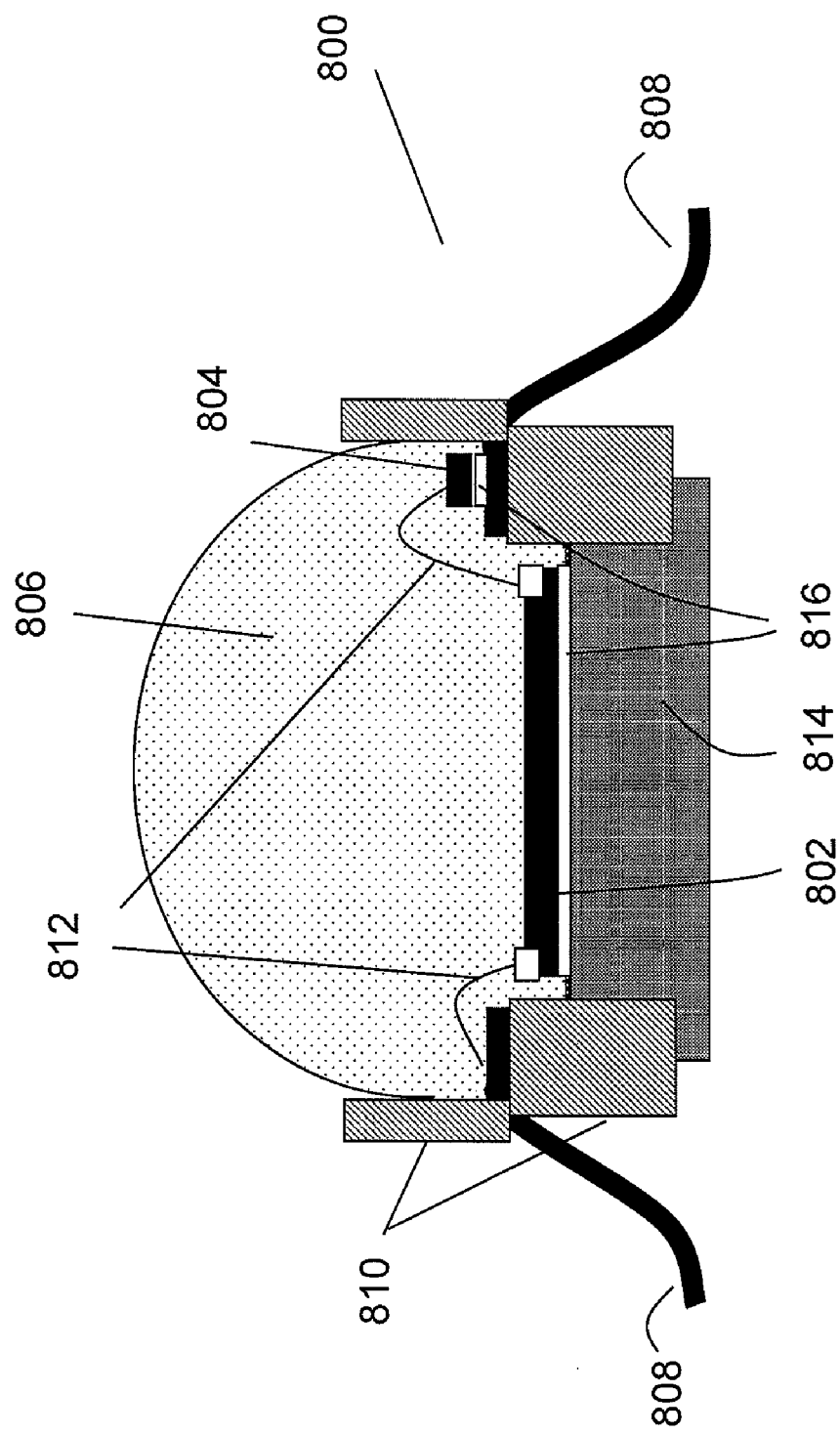
FIG. 8 shows an embodiment where a current-limiting resistor chip is integrated with AC/DC LED chip in a custom surface mounting package in order to function as a standard high-power AC lamp.

FIG. 8 shows another example in which the general principles are incorporated into a package arrangement 800 for an AC power LED chip 802 with a large chip size. This is normally a custom surface mounted package. A bare chip resistor 804 having suitable resistance is seated on one of the leads 808 of the package frame by silver paste or other solders, and electrically connected with this lead through its bottom contact. The AC-LED chip 802 is seated on a bottom metal slug 814 through a paste or solder 816 and included between insulation walls 810 and immersed in an encapsulate 806. With bonding wires 812, one electrode of the AC-LED is bonded to the other lead of the package frame, and the other electrode of AC-LED is bonded to the top contact of chip resistor 804, so that the resistor is in series connection with AC-LED chip. It should be noted that an AC-LED chip used in the FIG. 8 arrangement could also be a bare chip, and could also be a flip-chip bonded assembly including an AC-LED chip and submount.

Figure 9:
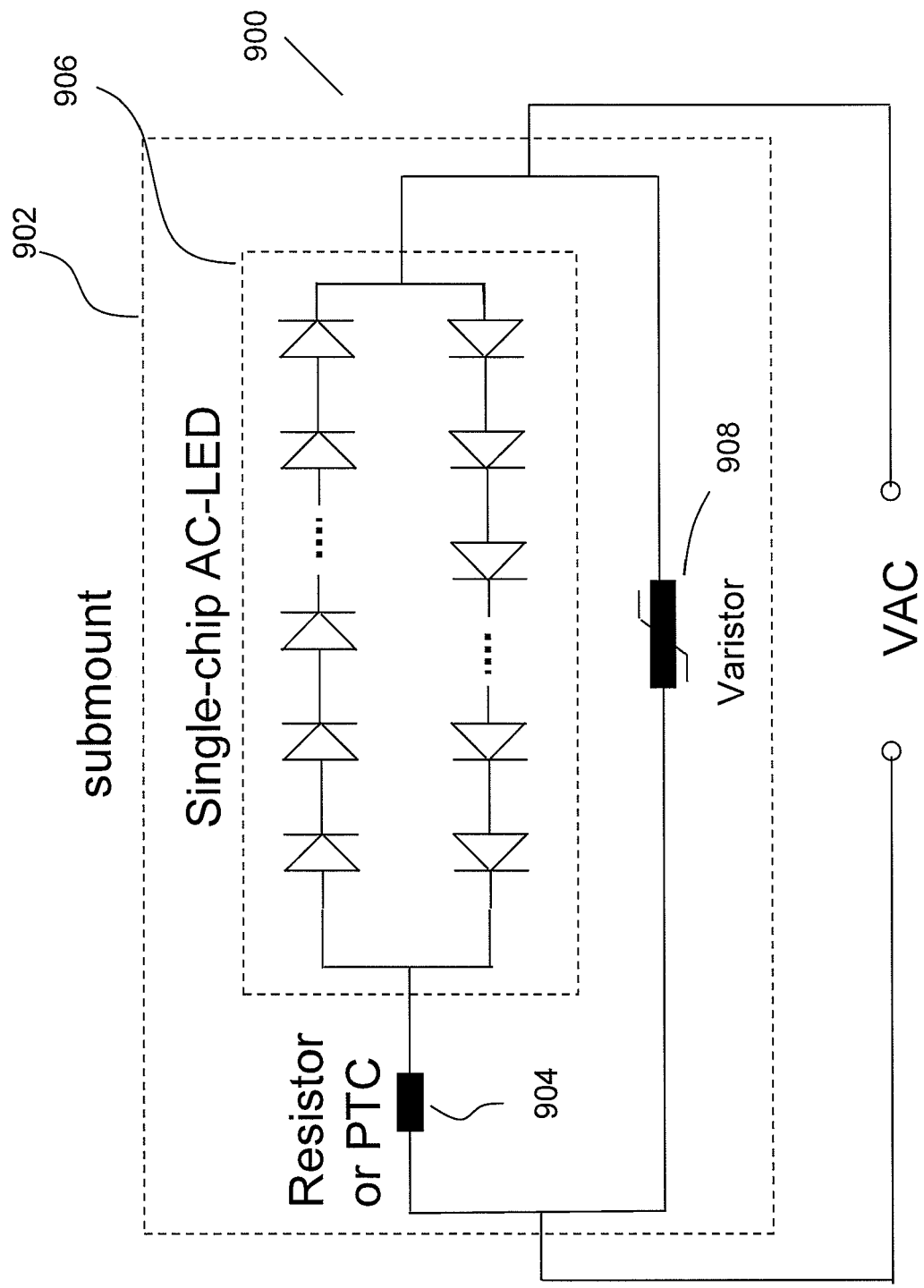
FIG. 9 shows an alternative embodiment in which the protection elements are integrated with AC/DC LED chip by incorporating them on the submount.

In another embodiment 900 disclosed in FIG. 9, an AC-LED chip 906 is flip-chip mounted on a submount 902 (see the description for FIG. 3(b) which discusses how this can be done), and the protection circuits and elements are then integrated onto that same submount 902. This arrangement enables the incorporation of more complex protection. For example, a varistor 908 can be integrated on the submount such that it is connected across the AC power input. Thus, when a power surge or voltage spike is sensed, the varistor's resistance rapidly decreases, creating an instant shunt path and protecting the AC-LED itself. In the disclosed preferred embodiment, metal oxide varistors (MOV) are preferred. But other devices could also be incorporated to accomplish the same objectives and still fall within the scope of the present invention.

Other arrangements could also be incorporated into the already described physical arrangements. For example, in FIG. 9, 904 is a tiny surface mounted resistor which is directly mounted on the submount, this device could be replaced with a positive temperature coefficient (PTC) thermistor.

During normal operating conditions, the PTC thermistor 904 is in a low resistance state. When an over-current condition occurs, elevated temperatures cause PTC thermistor 904 to switch into a high resistance state thereby limiting the current flow through the LED to a normal operating level. When the high-current condition is removed, the PTC thermistor resets to its low resistance state and permitting a normal operating current to flow through the LED device. These more complex configurations should not serve to eliminate the more basic possibilities that in other embodiments, basic resistor components could be deposed on the submount as well when the flip-chip technologies discussed above are used. Thus, basic lump or discrete resistors could be mounted to accomplish schematics similar to those shown in FIGS. 1(b)-(e) except that the devices would be included on the submount.

Besides the mentioned passive elements for protection, silicon integrated circuit (IC) bare chips which can be used to stabilize the voltage or limit the current can also be integrated on the submount to protect LED device.

It is also noted that the protection device arrangements disclosed above would also be useful for protection of AC/DC LEDs which are connected into a circuit board arrangement.

Having described the invention in detail, those skilled in the art will appreciate that, given the present disclosure; modification may be made without departing from the sprits of the invention concept described here. It is to be understood that while certain forms of this invention have been illustrated and described, it is not limited thereto, except in so far as such limitations are included in the following claims and allowable equivalents thereof.

Having thus described the invention, what is claimed as new and desired to be secured by Letters Patent is:

1. An illumination device including
   a plurality of LED devices on a semiconductor chip, said semiconductor chip having: (i) a buffer layer above a substrate; (ii) a doped n-type layer above said buffer layer; (iii) an active layer above the doped n-type layer; and (iv) a p-type layer above said active layer;
   said buffer layer, doped n-type layer, active layer, and p-type layer being etched away from areas between said LED devices to define said plurality;
   a first group of LEDs in a first current path;
   a second group of LEDs in a second current path; and
   a protection element monolithically integrated into said chip, said protection element comprised of an unetched portion of material in an area between said LEDs, said unetched portion being formed from one of or a combination of the buffer, doped n-type, or p-type layers;
   said protection element in electrical connection with said first and second groups of LEDs, said element protecting against at least one of voltage and current overages.

2. The device of claim 1 wherein said element is a resistor.

3. The device of claim 1 wherein said element is of an unremoved portion of the buffer layer in said area.

4. The device of claim 1 wherein said element is comprised of an unremoved portion of the doped n-type layer in said area.

5. The device of claim 1 wherein said element is comprised of an unremoved portion of the p-type layer in said area.

6. The device of claim 1 wherein said semiconductor chip is constructed of materials comprising: (i) III-Nitride materials GaN, InN, AlN, and their alloys AlGaN, InGaN, AlInN and AlGaInN; (iii) III-V materials GaAs, InP, AlGaAs, AlGaInP; (iv) ZnO, SiC; (v) organic semiconductors; (vi) organic electroluminescent materials; and (vii) polymer electroluminescent materials.

7. The device of claim 1 wherein said protection element is one of a plurality of protection elements, each of said plurality of said protection elements being electrically interposed between two of said plurality of LED devices, and the total resistance offered by said plurality of said protection elements protects said plurality of LEDs from excessive amperages.

8. The device of claim 1 wherein said chip has a size of less than about 0.5 mm by 0.5 mm and is, along with said protection element, able to be incorporated into a standard package for indicator-lamp purposes.

9. The device of claim 1, wherein said device is adapted to be operable using one of a 100 VAC, a 120 VAC, and a 220 VAC power source.

10. The device of claim 1 wherein the substrate is made of sapphire, the buffer layer is made of GaN, the doped n-type layer are made of Si-doped GaN, the active layer is a multi-quantum-well structure, and the p-type layer is made of GaN.

11. An illumination device including:
   an AC-LED array including a plurality of electrically connected LED devices on a semiconductor chip, said plurality of LED devices including a first group and a second group, the LED devices in said first group being electrically oriented relative to current flow in a direction opposite to a direction in which said second group is biased; and
   an integrated protection element included on said chip, said protection element being electrically connected with at least one of said first and second groups of LED devices, said element protecting against one of voltage and current overages.

12. The device of claim 11 wherein said protection element is a bare resistor chip on said semiconductor chip, said bare resistor chip electrically interposed between one of said electrically-connected LED devices and an electrode by conductive elements.

13. The device of claim 11 wherein said protection element is a thin-film resistor between an electrode on said semiconductor chip and one of said LED devices.

14. A method of making an illumination device, said device being adapted for an alternating source of voltage, said method comprising:
   creating a preform by:
      (i) depositing a buffer layer above a substrate;
      (ii) depositing and doping an n-layer above said buffer layer to create a doped n-type layer;
      (iii) depositing an active layer above said doped n-type layer; and
      (iv) depositing a p-type layer above said active layer;
   fabricating a plurality of LED devices on a chip by removing said buffer layer, doped n-type layer, active layer, and p-type layer from portions of said preform to define said plurality;
   establishing a first group of LEDs in a first current path and a second group of LEDs in a second current path on said chip to accommodate said alternating source of voltage;
   leaving a portion of one of said buffer layer, doped n-type layer, active layer, and p-type layer outside of the defined parameters of said plurality of LED devices to create a protective element;
   electrically incorporating said protective element into said first and second flow paths; and
   creating a resistance in said element such that said element is sufficient to protect against at least one of voltage and current overages.

15. The method of claim 14 comprising:
   forming said portion according to specifications generated by multiplying a resistivity for said semiconductor material by a cross sectional area of said portion and then dividing by a length of said portion.

16. The method of claim 14 wherein said integrating step further comprises:
   zigzagging said protective element on said chip in order to increase current travel distance through said element to increase resistivity.

17. An AC-LED system comprising:
   a plurality of LEDs serially mounted on a semiconductor chip substrate surface;
   said semiconductor chip being flip-mounted onto an upper surface of a submount; and
   a protection element located between said substrate surface and said upper surface of the submount, said protection element being serially electrically connected with said plurality of LEDs on said chip using conductive elements provided on the submount.

18. A fabrication process for a light emitting diode (LED) comprising:
   creating a preform by:
      (i) depositing a buffer layer above a substrate;
      (ii) depositing and doping an n-type layer above said buffer layer to create a doped n-type layer;
      (iii) depositing an active layer above said n-type layer; and
      (iv) depositing a p-type layer above said active layer;
   fabricating a plurality of LED devices on a chip by removing said buffer layer, doped n-type layer, active layer, and p-type layer from portions of said preform to define said plurality;
   establishing a first group of LEDs in a first current path and a second group of LEDs in a second current path on said chip;
   reverse biasing the first group of LEDs relative the second group of LEDs relative to a current direction;
   leaving a portion of one of said buffer layer, doped n-type layer, active layer, and p-type layer outside of the defined parameters of at least one of said plurality of LED devices;
   electrically incorporating said portion into at least one of said first and second flow paths; and
   creating a resistance in said portion such that said portion is sufficient to protect against at least one of voltage and current overages.

* * * * *